(12) United States Patent
Clucas

(10) Patent No.: US 11,451,886 B2
(45) Date of Patent: Sep. 20, 2022

(54) DATA PROCESSING DEVICES, DATA PROCESSING UNITS, METHODS AND COMPUTER PROGRAMS FOR PROCESSING TELEMETRY DATA

(71) Applicant: V-NOVA INTERNATIONAL LIMITED, London (GB)

(72) Inventor: Richard Clucas, London (GB)

(73) Assignee: V-NOVA INTERNATIONAL LIMITED

( * ) Notice: Subject to any disclaimer, the term of this patent is extended or adjusted under 35 U.S.C. 154(b) by 0 days.

(21) Appl. No.: 17/178,742

(22) Filed: Feb. 18, 2021

(65) Prior Publication Data

US 2021/0321175 A1    Oct. 14, 2021

Related U.S. Application Data

(63) Continuation of application No. 16/126,939, filed on Sep. 10, 2018, now Pat. No. 10,932,016, which is a (Continued)

(30) Foreign Application Priority Data

Mar. 11, 2016   (GB) ..................... 1604242

(51) Int. Cl.
*H04Q 9/02* (2006.01)
*H03M 7/30* (2006.01)
(Continued)

(52) U.S. Cl.
CPC ............... *H04Q 9/02* (2013.01); *H03M 7/00* (2013.01); *H03M 7/30* (2013.01); *H04W 4/38* (2018.02);
(Continued)

(58) Field of Classification Search
CPC ............ H04W 4/38; H04W 4/42; H04Q 9/02; H03M 7/00; G07C 5/008; G07C 5/00
See application file for complete search history.

(56) References Cited

U.S. PATENT DOCUMENTS 6,092,008 A    7/2000   Bateman
7,945,360 B2   5/2011   Nahapetian
(Continued)

OTHER PUBLICATIONS

Hogg, "A data compression primer", NASA Goddard Space Flight Center, Greenbelt, Maryland, X-521-65-320.
(Continued)

*Primary Examiner* — Daniell L Negron
(74) *Attorney, Agent, or Firm* — Workman Nydegger

(57) ABSTRACT

A data processing device for processing telemetry data obtains sampled data based on output data from a plurality of sensors associated with a vehicle. The data processing device generates first and second sets of sampled values using the sampled data. The first set of sampled values are associated with a first sampling time and the second set of sampled values are associated with a second, subsequent sampling time. The data processing device derives a set of data elements, a data element being indicative of a measure of a change between a sampled value in the first set and a corresponding sampled value in the second set, a position of a given data element in the set of data elements having been determined based on at least one mapping rule. The data processing device encodes the set of data elements and outputs data comprising at least the encoded set of data elements for transmission to a remote data processing unit.

20 Claims, 19 Drawing Sheets

Related U.S. Application Data continuation of application No. PCT/GB2017/050673, filed on Mar. 13, 2017.

(51) Int. Cl.
*H03M 7/00* (2006.01)
*H04W 4/38* (2018.01)
*G07C 5/00* (2006.01)
*H04W 4/42* (2018.01)

(52) U.S. Cl.
CPC ....... *G07C 5/008* (2013.01); *H04Q 2209/845* (2013.01); *H04W 4/42* (2018.02)

(56) References Cited

U.S. PATENT DOCUMENTS

| | | |
|---|---|---|
| 2006/0244587 A1 | 11/2006 | Humphries et al. |
| 2009/0240392 A1* | 9/2009 | Yamashita ............... H03M 7/46 714/E11.002 |
| 2012/0041638 A1 | 2/2012 | Johnson et al. |
| 2012/0123631 A1 | 5/2012 | Schurov |
| 2013/0343668 A1 | 12/2013 | Li |
| 2017/0228410 A1 | 8/2017 | Slusar |

OTHER PUBLICATIONS

Teledyne AirFASE Brochure, Teledyne Controls.
Salomon, Data Compression, The Complete Reference, Fourth Edition, 1.3.1 Relative Encoding, 2007, Springer, XP002771402, ISBN: 1-84628-602-6, pp. 26-27.
International Search Report and Written Opinion for PCT/GB0217/050673 dated Jul. 12, 2017.
Search Report for GB 1604242.6 dated Sep. 15, 2016.

* cited by examiner

300

| Sensor ID | Sampled Value At First Sampling Time, $t_1$ | Sampled Value At Second Sampling Time, $t_2$ | Difference Between Sampled Value At First Sampling Time, $t_1$, And Sampled Value At Second Sampling Time, $t_2$ |
|---|---|---|---|
| 1 | 10 | 10 | 0 |
| 2 | -2 | -2 | 0 |
| 3 | 1 | 2 | 1 |
| 4 | 22 | 22 | 0 |

DATA PROCESSING DEVICES, DATA PROCESSING UNITS, METHODS AND COMPUTER PROGRAMS FOR PROCESSING TELEMETRY DATA

CROSS-REFERENCE TO RELATED APPLICATIONS

This application is a continuation of U.S. patent application Ser. No. 16/126,939, filed Sep. 10, 2018, which is a continuation of International Patent Application No. PCT/GB2017/050673, filed Mar. 13, 2017, which claims priority to GB Application No. GB1604242.6, filed Mar. 11, 2016, under 35 U.S.C. § 119(a). Each of the above-referenced patent applications is incorporated by reference in its entirety.

BACKGROUND OF THE INVENTION

Field of the Invention

The present invention relates to data processing devices, data processing units, methods and computer programs for processing telemetry data.

Description of the Related Technology

Aircraft have a large number of sensors that can be used to obtain measurement data relating to the aircraft and/or flight. Such sensors may measure, for example, temperature, humidity, air pressure, altitude, control positions, mechanical strain on hardware components of the aircraft etc. Some aircraft contain over ten thousand such sensors.

An on-board flight recorder, often known as a "black box", records some such data and can be used to facilitate investigation of aviation accidents and incidents. A flight recorder can, however, be difficult, or in some cases impossible, to locate following an accident or incident. Further, flight recorders typically only record a relatively small number of the different types of measurement data available. For example, older flight recorders may record only five different types of measurement data. More recent flight recorders may record several hundred different types of measurement data, but this is still much less than the overall amount of measurement data available. In such cases, the flight recorders are not recording the other, potentially useful, measurement data.

In some known systems, a flight recorder records measurement data during a flight. The recorded data is downloaded from the aircraft following arrival at the flight destination, compressed and archived, for example on a hard disk drive. The archived data can then be analyzed, for example to assess degradation of aircraft parts, to predict when such parts might need to be repaired or replaced etc.

In other known systems, measurement data is transmitted to the ground during a flight. However, it may be impractical or impossible to transmit all of the measurement data available during the flight given the limited capacity of the communication channel to the ground and the large number of sensors.

SUMMARY

According to a first aspect of the present invention, there is provided a data processing device for processing telemetry data, the data processing device being configured to:

obtain sampled data, the sampled data being based on output data from a plurality of sensors associated with a vehicle;

generate first and second sets of sampled values using the sampled data, the first set of sampled values being associated with a first sampling time and the second set of sampled values being associated with a second, subsequent sampling time;

derive a set of data elements, a data element being indicative of a measure of a change between a sampled value in the first set of sampled values and a corresponding sampled value in the second set of sampled values, a position of a given data element in the set of data elements having been determined based on at least one mapping rule;

encode the set of data elements; and output data comprising at least the encoded set of data elements for transmission to a remote data processing unit.

According to a second aspect of the present invention, there is provided a data processing unit for processing telemetry data, the data processing unit being configured to:

receive data comprising an encoded set of data elements from a remote data processing device, a data element in the encoded set of data elements being indicative of a measure of a change between a sampled value in a first set of sampled values and a corresponding sampled value in a second set of sampled values, a position of a given data element in the set of data elements having been determined based on at least one mapping rule, the first set of sampled values being associated with a first sampling time and the second set of sampled values being associated with a second, subsequent sampling time, the first and second sets of sampled values having been generated using sampled data, the sampled data being based on output data sampled from a plurality of sensors associated with a vehicle;

decode the encoded set of data elements; and use at least the decoded set of data elements to recover the second set of sampled values.

According to a third aspect of the present invention, there is provided a method of processing telemetry data, the method comprising, at a data processing device:

obtaining sampled data, the sampled data being based on output data from a plurality of sensors associated with a vehicle;

generating first and second sets of sampled values using the sampled data, the first set of sampled values being associated with a first sampling time and the second set of sampled values being associated with a second, subsequent sampling time;

deriving a set of data elements, a data element being indicative of a measure of a change between a sampled value in the first set of sampled values and a corresponding sampled value in the second set of sampled values, a position of a given data element in the set of data elements having been determined based on at least one mapping rule;

encoding the set of data elements; and outputting data comprising at least the encoded set of data elements for transmission to a remote data processing unit.

According to a fourth aspect of the present invention, there is provided a method of processing telemetry data, the method comprising, at a data processing unit:

receiving data comprising an encoded set of data elements from a remote data processing device, a data element in the encoded set of data elements being indicative of a measure of a change between a sampled value in a first set of sampled values and a corresponding sampled value in a second set of sampled values, a position of a given data element in the set of data elements having been determined based on at least one mapping rule, the first set of sampled values being associated with a first sampling time and the second set of sampled values being associated with a second, subsequent sampling time, the first and second sets of sampled values having been generated using sampled data, the sampled data being based on output data sampled from a plurality of sensors associated with a vehicle;

decoding the encoded set of data elements; and using at least the decoded set of data elements to recover the second set of sampled values.

According to a fifth aspect of the present invention, there is provided a computer program comprising instructions which, when executed, cause a data processing device to perform a method comprising:

obtaining sampled data, the sampled data being based on output data from a plurality of sensors associated with a vehicle;

generating first and second sets of sampled values using the sampled data, the first set of sampled values being associated with a first sampling time and the second set of sampled values being associated with a second, subsequent sampling time;

deriving a set of data elements, a data element being indicative of a measure of a change between a sampled value in the first set of sampled values and a corresponding sampled value in the second set of sampled values, a position of a given data element in the set of data elements having been determined based on at least one mapping rule;

encoding the set of data elements; and outputting data comprising at least the encoded set of data elements for transmission to a remote data processing unit.

According to a sixth aspect of the present invention, there is provided a computer program comprising instructions which, when executed, cause a data processing unit to perform a method comprising:

receiving data comprising an encoded set of data elements from a remote data processing device, a data element in the encoded set of data elements being indicative of a measure of a change between a sampled value in a first set of sampled values and a corresponding sampled value in a second set of sampled values, a position of a given data element in the set of data elements having been determined based on at least one mapping rule, the first set of sampled values being associated with a first sampling time and the second set of sampled values being associated with a second, subsequent sampling time, the first and second sets of sampled values having been generated using sampled data, the sampled data being based on output data sampled from a plurality of sensors associated with a vehicle;

decoding the encoded set of data elements; and using at least the decoded set of data elements to recover the second set of sampled values.

According to a seventh aspect of the present invention, there is provided a data processing device for processing telemetry data, the data processing device being configured to:

obtain sampled data, the sampled data being based on output data from a plurality of sensors associated with a vehicle;

generate first and second sets of sampled values using the sampled data, the first set of sampled values being associated with a first sampling time and the second set of sampled values being associated with a second, subsequent sampling time;

derive a set of data elements, a data element being indicative of a measure of a change between a sampled value in the first set of sampled values and a corresponding sampled value in the second set of sampled values;

encode the set of data elements; and output data comprising at least the encoded set of data elements for transmission to a remote data processing unit.

According to an eighth aspect of the present invention, there is provided a data processing unit for processing telemetry data, the data processing unit being configured to:

receive data comprising an encoded set of data elements from a remote data processing device, a data element in the encoded set of data elements being indicative of a measure of a change between a sampled value in a first set of sampled values and a corresponding sampled value in a second set of sampled values, the first set of sampled values being associated with a first sampling time and the second set of sampled values being associated with a second, subsequent sampling time, the first and second sets of sampled values having been generated using sampled data, the sampled data being based on output data sampled from a plurality of sensors associated with a vehicle;

decode the encoded set of data elements; and use at least the decoded set of data elements to recover the second set of sampled values.

Further features and advantages will become apparent from the following description of embodiments, given by way of example only, which is made with reference to the accompanying drawings.

DETAILED DESCRIPTION OF CERTAIN INVENTIVE EMBODIMENTS

Figure 1:
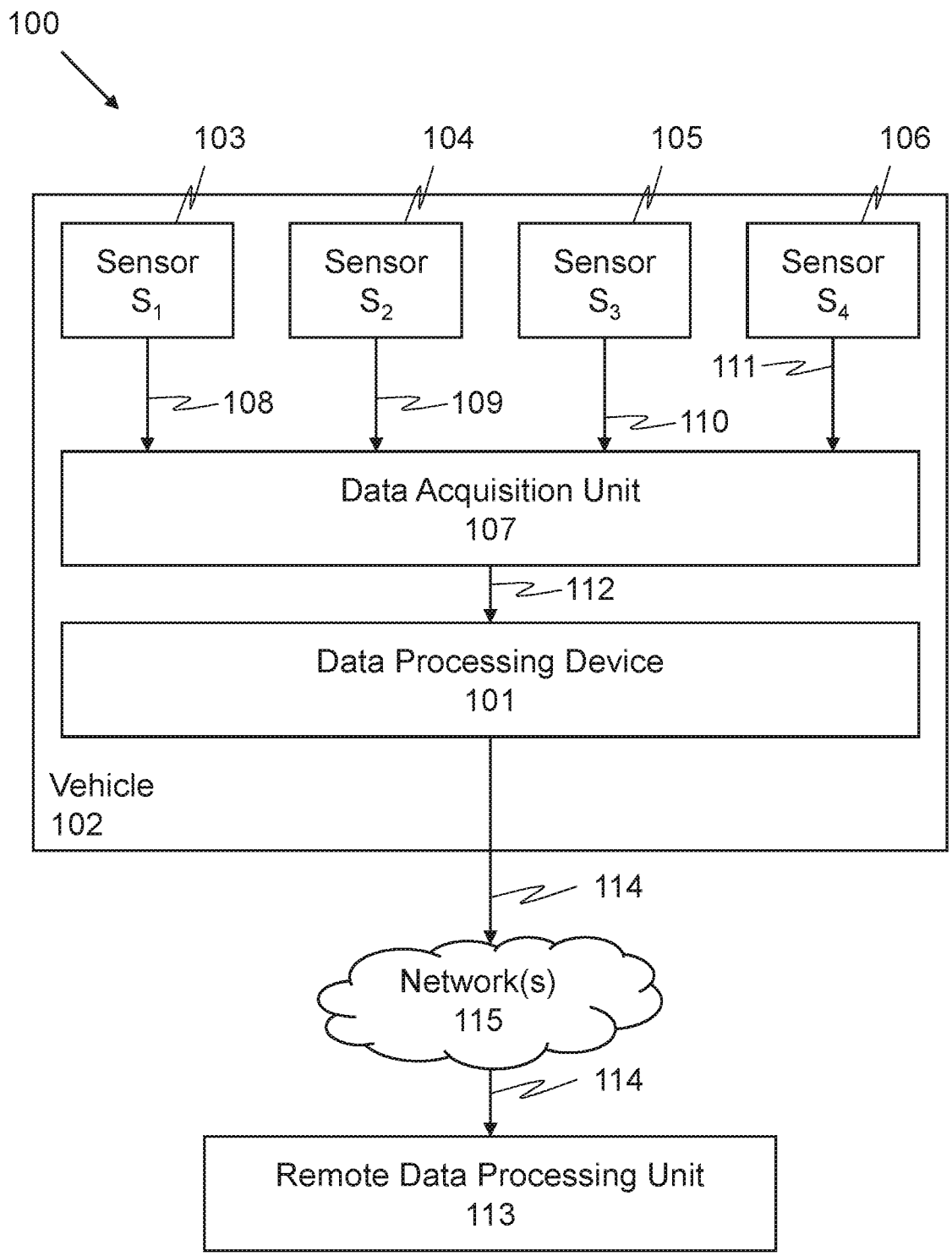
FIG. 1 shows a schematic block diagram of an example of a data processing system in accordance with an embodiment of the present invention.

Referring to FIG. 1, there is shown a schematic block diagram of an example of a data processing system 100.

The data processing system 100 includes a data processing device 101. The data processing device 101 is configured to process telemetry data. Telemetry concerns collecting one or more measurements at a first site and making the one or more measurements available at a second, remote site.

The data processing device 101 may comprise one or more hardware and/or one or more software components. In some examples, the data processing device 101 is a dedicated device whose sole function is to process telemetry data in the manner described herein.

The data processing device 101 is associated with a vehicle 102. In this example, the data processing device 101 is provided in the vehicle 102. For example, the data processing device 101 may be mounted inside the vehicle. Examples of vehicle include, but are not limited to, aircraft, spacecraft, road vehicles, boats etc.

A plurality of sensors 103, 104, 105, 106 is associated with the vehicle 102. The sensors 103, 104, 105, 106 may be associated with the vehicle 102 by being provided in and/or on the vehicle 102.

In this specific example, the data processing system 100 includes four sensors 103, 104, 105, 106, denoted $S_1, S_2, S_3, S_4$ respectively. It will be appreciated that a different number of sensors 103, 104, 105, 106 could however be used. In reality, significantly more than four sensors 103, 104, 105, 106 may be used. Tens of thousands of sensors, or even more, could be used in an aircraft for example. In other examples, fewer than four sensors 103, 104, 105, 106 could be used.

A sensor 103, 104, 105, 106 measures at least one physical property and produces corresponding output data. Examples of such physical property include, but are not limited to, temperature, pressure, speed, direction, altitude, mechanical strain, operating position of a button, operating position of a switch etc. Such a physical property may relate to the vehicle 102 itself, for example in the case of an operating position of a switch on the vehicle 102. Such a physical property may relate to an environment in which the vehicle 102 is located, for example, in the case of a temperature outside the vehicle 102.

Output data from a sensor 103, 104, 105, 106 may take different forms. The form of the output data may depend on the nature of the sensor 103, 104, 105, 106. The form of the output data may depend on the nature of the at least one physical property the sensor 103, 104, 105, 106 is measuring. In some examples, the sensor 103, 104, 105, 106 outputs data in an analogue form. In some examples, the sensor 103, 104, 105, 106 outputs data in a digital form. In some examples, the output data includes further data in addition to data corresponding to the at least one measured physical property. An example of such further data includes data identifying the sensor 103, 104, 105, 106.

In some examples, a sensor 103, 104, 105, 106 is configured to output data continuously. In other examples, a sensor 103, 104, 105, 106 is configured to output data intermittently. For example, a sensor 103, 104, 105, 106 may be configured to output data periodically.

The output data from the sensors 103, 104, 105, 106 is sampled at one or more sampling rates. For example, the sensors 103, 104, 105, 106 may be synchronized so that they are all sampled at the same sampling rate. Alternatively, at least some of the sensors 103, 104, 105, 106 may be sampled at different sampling rates.

The data processing device 101 is configured to obtain sampled data. The sampled data is based on the output data from the sensors 103, 104, 105, 106.

In some examples, the data processing device 101 obtains the sampled data by directly sampling the output data of the sensors 103, 104, 105, 106 at various different sampling times. In some examples, the data processing device 101 obtains the sampled data by receiving the sampled data from one or more entities intermediate the data processing device 101 and the sensors 103, 104, 105, 106.

In this example, the data processing system 100 comprises a data acquisition unit 107. In this example, the data acquisition unit 107 provides the functionality of the one or more intermediate entities referred to above. In particular, in this example, the data acquisition unit 107 directly samples the output data from the sensors 103, 104, 105, 106 and outputs sampled data based on such sampling to the data processing device 101. The data acquisition unit 107 may comprise one or more hardware and/or one or more software components configured to provide the sampling functionality.

In this example, the data acquisition unit 107 is separate from the data processing device 101. In this example, the data acquisition unit 107 samples the output data from the sensors 103, 104, 105, 106 via a respective connection 108, 109, 110, 111 with each of the sensors 103, 104, 105, 106. The connections 108, 109, 110, 111 may be physical or logical connections. In this example, the data acquisition unit 107 outputs the sampled data to the data processing device 101 via a single connection 112. In this example, the data processing device 101 therefore has a single connection 112 to the data acquisition unit 107 and the data acquisition unit 107 has multiple connections 108, 109, 110, 111 to the sensors 103, 104, 105, 106. In such an example, the data processing device 101 is indirectly connected to some or all the sensors 103, 104, 105, 106.

In another example, the data processing device 101 comprises the data acquisition unit 107 and the associated sampling functionality. In such an example, the data processing device 101 samples the output data from the plurality of sensors 103, 104, 105, 106 directly by receiving the output data from the sensors 103, 104, 105, 106 and taking samples of the output data at different sampling times. In such an example, the data processing device 101 is directly connected to some or all of the sensors 103, 104, 105, 106.

In some examples, the vehicle 102 is an aircraft. In some examples, the data processing device 101 is compatible with existing hardware and/or software on the aircraft. In some examples, the data processing device 101 replaces one or more existing hardware and/or software components on the aircraft to provide the functionality described herein. In some examples, the data processing device 101 cooperates with existing hardware and/or software to provide the functionality described herein.

In some such examples, the data acquisition unit 107 comprises one or more flight-data acquisition units (FDAUs).

An FDAU receives output data from the sensors 103, 104, 105, 106. The FDAU may receive the output data from the sensors 103, 104, 105, 106 in a specific data format. In some examples, the specific data format complies with one or more standards. Examples of such standardized communication protocols, developed by Aeronautical Radio, Incorporated (ARINC), are ARINC 429 and ARINC 717.

The FDAU outputs sampled data based on the output data from the sensors 103, 104, 105, 106 to one or more entities. The data output by the FDAU may be in a specific data format. In some examples, the specific data format complies with one or more standards. Examples of such standards, developed by ARINC, are ARINC 573, ARINC 717 and ARINC 747.

An example of an entity to which the FDAU may output sampled data is a flight data recorder (FDR). An FDR records data relating to a flight. An FDR is designed to survive an accident involving the aircraft. In some such examples, the data processing device 101 performs the function of an FDR. The data processing device 101 may operate in association with an existing FDR or may replace an existing, for example legacy, FDR.

Another example of an entity to which the FDAU may output sampled data is a quick access recorder (QAR). A QAR is a flight data recorder designed to provide quick and easy access to raw data relating to a flight. A QAR may record more types of data than an FDR. A QAR may be able to sample data from the FDAU at a higher rate than that achievable by an FDR. In some such examples, the data processing device 101 performs the function of a QAR. The data processing device 101 may operate in association with an existing QAR or may replace an existing, for example legacy, QAR.

Where the data processing device 101 is used in association with an aircraft, the data processing device 101 may therefore be considered to be a virtual flight recorder (or "virtual black box").

The data processing device 101 is configured to generate first and second sets of sampled values using the sampled data. The first set of sampled values is associated with a first sampling time. The second set of sampled values is associated with a second, subsequent sampling time.

Quantization involves constraining a continuous set of values to a relatively small set of discrete values. For example, suppose the output data of a given sensor varies continuously between "0" and "10" inclusive and that the output data is quantized by rounding it to the nearest integer. An unquantized output value of "4.7" would therefore correspond to a quantized value of "5". Quantization may reduce the amount of telemetry data that needs to be transmitted. For example, a number between "0" and "10" inclusive can be represented using only four bits, whereas representing non-quantized values may require more than four bits. However, quantization comes at the cost of decreased granularity, detail and accuracy of the output data. In scenarios in which granularity, detail and accuracy are important, it may be preferable not to use quantization and to report some or all of the actual, unquantized measured values instead. This may be important, for example, where the telemetry data relates to data obtained from aircraft sensors. As such, in some examples, some or all of the sampled values in the first set and/or second set of sampled values are unquantized versions of values obtained from the output data of some or all of the sensors 103, 104, 105, 106. In some examples, however, some or all of the sampled values in the first set and/or second set of sampled values are quantized versions of values obtained from at least some of the sensors 103, 104, 105, 106. Quantization may in some cases be beneficial, for example where granularity, detail and accuracy are less important than the amount of data to be transmitted.

The data processing device 101 is configured to derive a set of data elements. A data element is indicative of a measure of a change between a sampled value in the first set of sampled values, associated with the first sampling time, and a corresponding sampled value in the second set of sampled values associated with the second sampling time. In this example, "corresponding" refers to the sampled value in the first set of sampled values and the second set of sampled values having been obtained from the same sensor as each other.

In some examples, the measure of the change is a difference between the sampled value in the first set of sampled values and the corresponding sampled value in the second set of sampled values. In some examples, the difference is calculated by subtracting the sampled value in the first set of sampled values from the corresponding sampled value in the second set of sampled values. In some examples, the difference is calculated by subtracting the sampled value in the second set of sampled values from the corresponding sampled value in the first set of sampled values. In other examples, a different measure of the change may be used. For example, the measure of the change may be a ratio of the sampled value in the first set relative to the sampled value in the second set.

The data processing device 101 is configured to encode the set of data elements. Encoding relates to converting data from one form into another form. In this example, the data processing device 101 is configured to convert the set of data elements from one form into another form.

The data processing device 101 is configured to output the encoded set of data elements for transmission to a remote data processing unit 113 in the data processing system 100. In some examples, the data processing device 101 outputs the encoded set of data elements to at least one other entity in the data processing system 100 and the at least one other entity transmits the encoded set of data elements to the remote data processing unit 113. In other examples, the data processing device 101 has the capability to transmit the encoded set of data elements to the remote data processing unit 113 itself. In some examples, the data processing device 101 transmits the encoded set of data elements to the remote data processing unit 113 itself and also outputs the encoded set of data elements to at least one other entity in the data processing system 100 so that the at least one other entity can also transmit the encoded set of data elements to the remote data processing unit 113.

The encoded set of data elements is transmitted to the remote data processing unit 113 over one or more communication channels 114 established via one or more data communications networks 115. In some examples, the transmission of the encoded set of data elements includes wireless transmission of the encoded set of data elements to the remote data processing unit 113 via a wireless data communications network. In some such examples, the data communications network 115 is a satellite network.

In this example, the data processing system 100 allows telemetry data to be transmitted substantially in real-time (or "live"). The term "substantially" in relation to real-time transmission of telemetry data is used herein as there are inevitably delays in obtaining, processing and transmitting the telemetry data from the data processing device 101 to the remote data processing unit 113.

In the case of the vehicle 102 being an aircraft, the data processing device 101 may be configured to transmit telemetry data "in-flight" and/or "in-journey". The term "in-flight" is used herein to mean the part of the journey in which the aircraft is in the air. The term "in-journey" is used herein to include the part of the journey in which the aircraft is in the air and also one or more other parts of the journey, for example fueling and/or taxiing.

The telemetry data transmitted from the data processing device 101 to the remote data processing unit 113 may be used by one or more interested parties. Examples of such interested parties include, but are not limited to, a manufacturer of the vehicle 102 and a service that runs or manages the vehicle 102. Such data may be used, for example, for failure detection and/or prediction, live diagnostics, metrological purposes and the like.

In some examples, the vehicle 102 is an aircraft. In such examples, the telemetry data may be used for flight operations quality assurance (FOQA), flight data monitoring (FDM) or flight data analysis purposes. Analysis of the telemetry data may help to improve flight safety and/or operational efficiency, in particular where the telemetry data is transmitted substantially in real-time.

The communication channel 114 between the data processing device 101 and the remote data processing unit 113 may have a relatively low bandwidth compared to the amount of raw measurement data it would be desirable to transmit to the remote data processing unit 113. The communication channel 114 may additionally or alternatively have a high usage cost such that transmitting all of the raw measurement data would be particularly, and potentially prohibitively, expensive. The term "raw measurement data" is used herein to mean the measurement data available to the data processing device 101 relating to the output data of the sensors 103, 104, 105, 106. Raw measurement data may include sampled values, and other related data. An example of such other related data is sensor identification data.

Taking the example of the vehicle 102 being an aircraft, the measurement data for a single sensor may, for example, comprise 32 bits. The measurement data may comprise a first, static portion, a middle, dynamic payload portion, and a final, static portion. The initial, static portion may for example comprise sensor identification data. The middle, dynamic portion may comprise a sampled value. Assuming the aircraft has 18,000 sensors and that each sensor is sampled at a sampling rate of 18 Hz, the required data rate for transmitting all of the raw measurement data would be 32*18,000*18≈10 Mbit/s, which is significantly higher than the 64 kbit/s capacity of a satellite connection over the poles.

Encoding of the set of data elements reduces the amount of data required to transmit the set of data elements to the remote data processing unit 113. The extent of encoding required may be determined based on one or more factors. Some or all of the one or more factors may be associated with one or more characteristics of the communication channel 114 between the data processing device 101 and the remote data processing unit 113. For example, the capacity of the communication channel 114 may impose restrictions or constraints on the extent of encoding required to be able to communicate the telemetry data via the communication channel 114. Another factor may be the cost of sending data via the communication channel 114. The cost of sending data via the communication channel 114 may depend, for example, on the nature of the communication channel 114. The extent of encoding required may additionally or alternatively be determined based on hardware and/or software constraints of one or more entities in the data processing system 100. For example, encoding and decoding capabilities in the data processing system 100 may affect the extent to which encoding is used and/or the type of encoding that is used.

In this example, the data processing device 101 is configured to encrypt the first set of sampled values prior to outputting the first set of sampled values in an encrypted form for transmission to the remote data processing unit 113.

In this example, the data processing device 101 is configured to output the set of data elements in plaintext, unencrypted form for transmission to the remote data processing unit 113.

If a third party were to obtain the plaintext, unencrypted set of data elements, they could potentially infer the extent to which output data from a sensor 103, 104, 105, 106 has changed since a previous sampling time. However, such information may be less sensitive than knowing the absolute values of the output data from sensors 103, 104, 105, 106, which could be inferred from the first set of sampled values. As such, the first set of sampled values is, in this example, encrypted prior to transmission. In this example, a data element in the set of data elements is indicative of a measure of a change between an unencrypted sampled value in the first set of sampled values and a corresponding sampled value in the second set of sampled values.

In some examples, the data processing device 101 is configured to encode the set of data elements using a first codec and to encode the first set of sampled values using a second, different codec.

In some examples, the data processing device 101 is configured to encode the set of data elements and/or the first set of sampled values based on at least one characteristic of the set of data elements and/or the first set of sampled values. An example of such a characteristic is a manner in which the set of data elements and/or the first set of sampled values is arranged. For example, the set of data elements and/or the first set of sampled values may be encoded using a specific encoding technique, for example an image coding technique, if they are arranged in the form of an array. Further, different types of array may be encoded differently. Another example of such a characteristic is a type of data included in the set of data elements and/or the first set of sampled values. For example, numerical data may be encoded differently from other types of data. Another example of such a characteristic is a variation of data included in the set of data elements and/or the first set of sampled values. For example, data that varies widely across the set of data elements and/or the first set of sampled values may be encoded differently from data that is less varied.

In some examples, the data processing device 101 is configured to encode the set of data elements and/or the first set of sampled values using one or more image encoding techniques. In some examples described herein, the set of data elements and/or the first set of sampled values are arranged in the form of an array of numerical values, which may make them suited to being encoded using the one or more image encoding techniques.

In some examples, the data processing device 101 is configured to encode the set of data elements and/or the first set of sampled values using one or more video encoding techniques. In some examples described herein, the set of data elements and/or the first set of sampled values are arranged in the form of an array of numerical values, and there is a temporal correlation between the set of data elements and/or the first set of sampled values, which may make them suited to being encoded using the one or more video encoding techniques.

In some examples, the data processing device 101 is configured to encode the set of data elements and/or the first set of sampled values using one or more lossless encoding techniques. An example of a lossless encoding technique is Run-Length Encoding (RLE). Using a lossless encoding technique allows all of the information being encoded to be recovered by a decoder. This may be beneficial where the accuracy and completeness of the information is important. However, information encoded using a lossless coding technique may require more data than using a lossy encoding technique.

In some examples, the data processing device 101 is configured to encode the set of data elements and/or the first set of sampled values using one or more entropy encoding techniques. Entropy encoding techniques are a form of lossless encoding technique. Examples of entropy coding techniques include, but are not limited to, Hufmann coding, arithmetic coding and range encoding. The reader is referred to WO-A2-2013/011495, which describes various examples of entropy encoding techniques. The entire contents of WO-A2-2013/011495 are hereby incorporated herein by reference.

In some examples, the data processing device 101 is configured to encode the set of data elements and/or the first set of sampled values using a lossy encoding technique. As indicated above, a lossy encoding technique may result in less data being used than with a lossless encoding technique but this comes at the cost of reduced accuracy and completeness of the information recoverable by the decoder.

In some examples, the data processing device 101 is configured not to encode the second set of sampled values. In some examples, the data processing device 101 is configured not to output the second set of sampled values for transmission to the remote data processing unit 113. In some examples described herein, and in contrast to existing image or video encoding techniques, the data processing device 101 encodes the first set of sampled values and the set of data elements and transmits such encoded data to the remote data processing unit 113. The remote data processing unit 113 can then recover or reconstruct the second set of sampled values using the first set of sampled values and the set of data elements without the data processing device 101 having to encode or output for transmission the second set of sampled values. Existing image or video encoding techniques may for example encode both the first and second sets of sampled values and not create such a set of data elements indicative of measures of changes between corresponding sampled values in the first and second sets of sampled values. As will be described in more detail below, encoding and outputting for transmission the first set of sampled values and the set of data elements but not encoding or outputting for transmission the second set of sampled values may reduce the amount of data to be transmitted to the remote data processing unit 113 while still enabling the remote data processing unit 113 to recover the second set of sampled values.

In some examples, the data processing device 101 is configured not to encode the first set of sampled values. In some examples, the data processing device 101 is configured not to output the first set of sampled values for transmission to the remote data processing unit 113. In such examples, the data processing device 101 and the remote data processing unit 113 may have a common set of reference values and the data processing device 101 may output for transmission to the remote data processing unit 113 an initial set of data elements indicative of a measure of a change between the set of reference values and the first set of sampled values. The remote data processing unit 113 may then use the initial set of data elements to obtain the first set of sampled values from the common set of reference values.

The techniques described herein are particularly, but not exclusively, efficient where the output data from a relatively large number of the sensors 103, 104, 105, 106 changes relatively slowly and/or where the output data from a relatively low number of the sensors 103, 104, 105, 106 changes relatively quickly.

Figure 2:
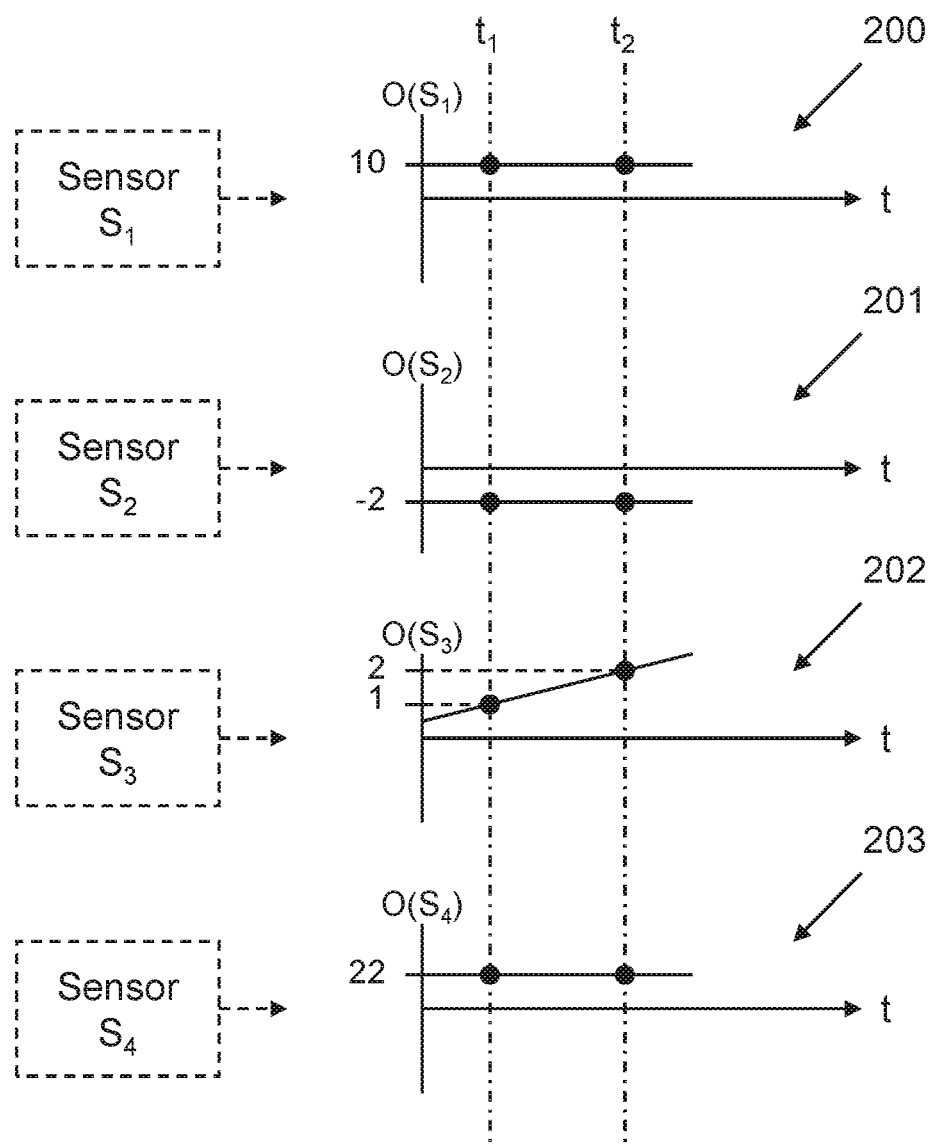
FIG. 2 shows a schematic diagram of a series of graphs illustrating examples of output data from a plurality of sensors associated with a vehicle.

Referring to FIG. 2, there is shown schematically a series of graphs illustrating examples of output data from a plurality of sensors $S_1$, $S_2$, $S_3$, $S_4$ associated with a vehicle. In this example, output data from four sensors $S_1$, $S_2$, $S_3$, $S_4$ is illustrated.

In this example, the output of an $i^{th}$ sensor, $S_1$, is denoted $O(S_1)$. For example, the output of sensor $S_1$ is denoted $O(S_1)$.

Output data from the first sensor $S_1$ is shown in a first graph 200. The first graph 200 indicates how the output, $O(S_1)$, of the first sensor $S_1$ varies over time, t. In this example, the output, $O(S_1)$, of the first sensor $S_1$ remains at a constant value of "10" during the time period shown on the first graph 200. In this example, the output, $O(S_1)$, of the first sensor $S_1$ at a first sampling time, $t_1$, is "10" and the output, $O(S_1)$, of the first sensor $S_1$ at a second sampling time, $t_2$, is also "10". As such, the difference between the output, $O(S_1)$, of the first sensor $S_1$ at the first sampling time, $t_1$, and the output, $O(S_1)$, of the first sensor $S_1$ at the second sampling time, $t_2$, is "0".

Output data from the second sensor $S_2$ is shown in a corresponding second graph 201. The second graph 201 indicates how the output, $O(S_2)$, of the second sensor $S_2$ varies over time, t. In this example, the output, $O(S_2)$, of the second sensor $S_2$ remains at a constant value of "−2" during the time period shown on the second graph 201. In this example, the output, $O(S_2)$, of the second sensor $S_2$ at the first sampling time, $t_1$, is "−2" and the output, $O(S_2)$, of the second sensor $S_2$ at the second sampling time, $t_2$, is also "−2". As such, the difference between the output, $O(S_2)$, of the second sensor $S_2$ at the first sampling time, $t_1$, and the output, $O(S_2)$, of the second sensor $S_2$ at the second sampling time, $t_2$, is "0".

Output data from the third sensor $S_3$ is shown in a corresponding third graph 202. The third graph 202 indicates how the output, $O(S_3)$, of the third sensor $S_3$ varies over time, t. In this example, the output, $O(S_3)$, of the third sensor $S_3$ increases linearly over time during the time period shown on the third graph 202. In this example, the output, $O(S_3)$, of the third sensor $S_3$ at the first sampling time, $t_1$, is "1" and the output, $O(S_3)$, of the third sensor $S_3$ at the second sampling time, $t_2$, increases to "2". As such, the difference between the output, $O(S_3)$, of the third sensor $S_3$ at the first sampling time, $t_1$, and the output, $O(S_3)$, of the third sensor $S_3$ at the second sampling time, $t_2$, is "1".

Output data from the fourth sensor $S_4$ is shown in a corresponding fourth graph 203. The fourth graph 203 indicates how the output, $O(S_4)$, of the fourth sensor $S_4$ varies over time, t. In this example, the output, $O(S_4)$, of the fourth sensor $S_4$ remains at a constant value of "22" during the time period shown on the fourth graph 203. In this example, the output, $O(S_4)$, of the fourth sensor $S_4$ at the first sampling time, $t_1$, is "22" and the output, $O(S_4)$, of the fourth sensor $S_4$ at the second sampling time, $t_2$, is also "22". As such, the difference between the output, $O(S_4)$, of the fourth sensor $S_4$ at the first sampling time, $t_1$, and the output, $O(S_4)$, of the fourth sensor $S_4$ at the second sampling time, $t_2$, is "0".

Although the output data from the plurality of sensors $S_1$, $S_2$, $S_3$, $S_4$ is shown in the form of straight lines, it will be appreciated that in reality the output data from the plurality of sensors $S_1$, $S_2$, $S_3$, $S_4$ may fluctuate slightly and deviate slightly from a perfect straight line while still remaining substantially linear. Furthermore, while the output data has been shown using straight lines for ease of explanation, it will be appreciated that, in reality, the output data may take many different forms depending, for example, on the nature of the associated sensor and/or the physical quantity being monitored.

Figure 3:
FIG. 3 shows a table comprising example data generated by a data processing device in accordance with an embodiment of the present invention.

Referring to FIG. 3, there is shown a table 300 comprising example data generated by a data processing device.

It will be appreciated that the data processing device may not store measurement data in the form of the table 300. The table 300 contains the sampled values obtained from the output, $O(S_1)$, $O(S_2)$, $O(S_3)$, $O(S_4)$, of the four sensors $S_1$, $S_2$, $S_3$, $S_4$ described above with reference to FIG. 2. The table 300 therefore includes sampled values obtained from four sensors, $S_1$, $S_2$, $S_3$, $S_4$ at two different sampling times and corresponding data element values.

A first sampled value of "10" is obtained from the first sensor $S_1$ at the first sampling time, $t_1$, and a second sampled value of "10" is obtained from the first sensor $S_1$ at the second sampling time, $t_2$. The difference between the second sampled value and the first sampled value obtained from the first sensor $S_1$ is therefore "0". In this example, the difference is calculated by subtracting the first sampled value of "10" from the second sampled value of "10".

A first sampled value of "–2" is obtained from the second sensor $S_2$ at the first sampling time, $t_1$, and a second sampled value of "–2" is obtained from the second sensor $S_2$ at the second sampling time, $t_2$. The difference between the second sampled value and the first sampled value obtained from the second sensor $S_2$ is therefore "0". In this example, the difference is calculated by subtracting the first sampled value of "–2" from the second sampled value of "–2".

A first sampled value of "1" is obtained from the third sensor $S_3$ at the first sampling time, $t_1$, and a second sampled value of "2" is obtained from the third sensor $S_3$ at the second sampling time, $t_2$. The difference between the second sampled value and the first sampled value obtained from the third sensor $S_3$ is therefore "1". In this example, the difference is calculated by subtracting the first sampled value of "1" from the second sampled value of "2".

A first sampled value of "22" is obtained from the fourth sensor $S_4$ at the first sampling time, $t_1$, and a second sampled value of "22" is obtained from the fourth sensor $S_4$ at the second sampling time, $t_2$. The difference between the second sampled value and the first sampled value obtained from the fourth sensor $S_4$ is therefore "0". In this example, the difference is calculated by subtracting the first sampled value of "22" from the second sampled value of "22".

Figure 4:
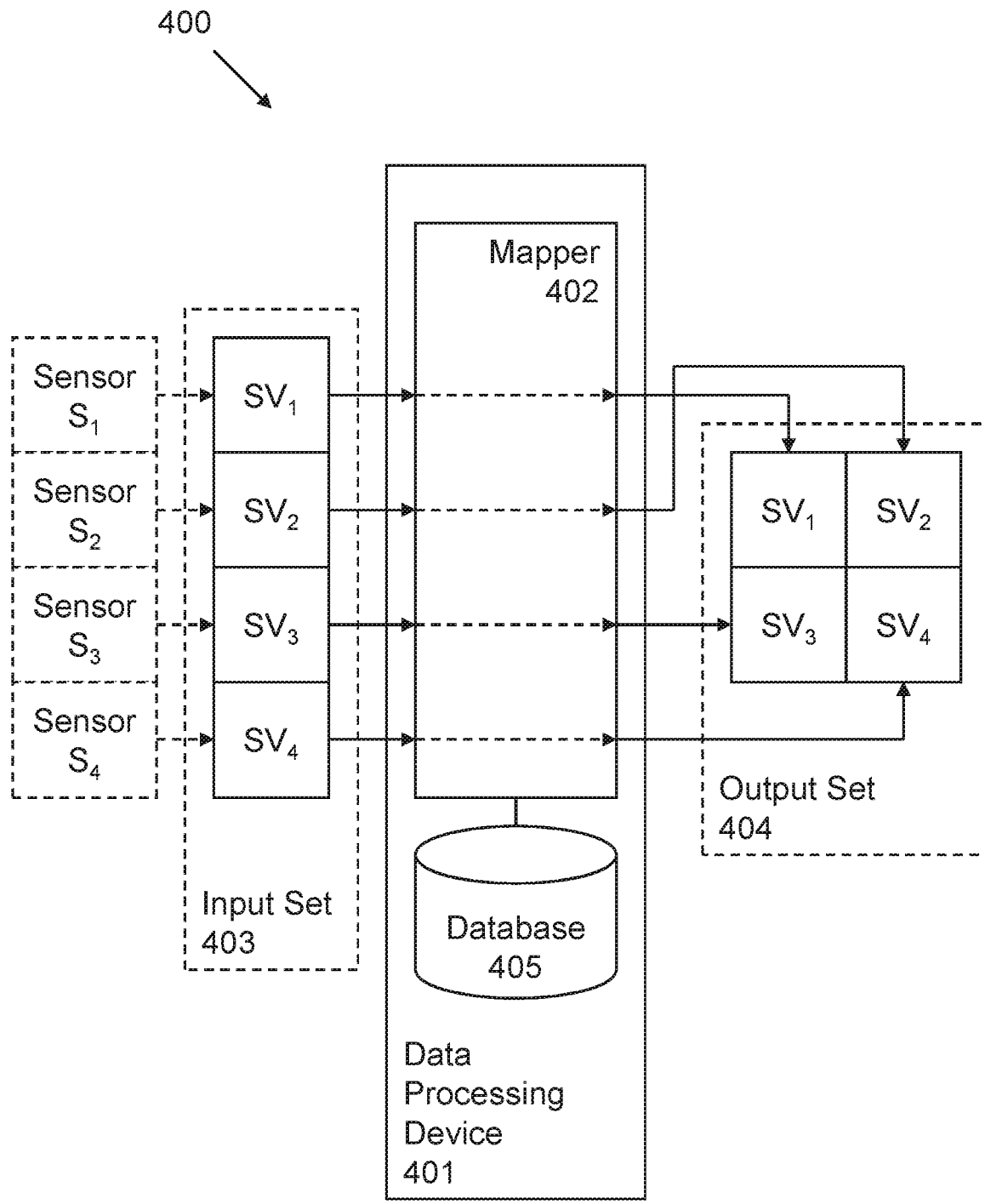
FIG. 4 shows a schematic block diagram of an example of a data processing system in accordance with an embodiment of the present invention.

Referring to FIG. 4, there is shown a schematic block diagram of an example of a data processing system 400.

The data processing system 400 includes a data processing device 401. The data processing device 401 may have some or all of the same functionality as the data processing device 101 described above with reference to FIG. 1. In this example, the data processing device 401 receives sampled values from a data acquisition unit (not shown). The data acquisition unit may have some or all of the same functionality as the data acquisition unit 107 described above with reference to FIG. 1. As described above, the data acquisition unit may be comprised in the data processing device 401 or may be separate from the data processing device 401.

In this example, the data processing device 401 includes a mapper 402. The mapper 402 may comprise one or more hardware and/or one or more software components configure to provide mapping functionality. In some examples, the mapper 402 is a logical component of the data processing device 401.

In this example, the mapper 402 receives input data from the data acquisition unit (not shown) and maps the input data to output data. Such mapping may involve preserving and/or changing the order of at least some of the output data in relation to the order of the input data as will be described in detail below.

In this example, a sampled value obtained from an $i^{th}$ sensor, $S_i$, is denoted $SV_i$. For example, a sampled value obtained from a first sensor, $S_1$, is denoted $SV_1$.

In this example, an input set of sampled values 403 includes a first sampled value $SV_1$ obtained from the first sensor $S_1$. The input set of sampled values 403 further includes a second sampled value $SV_2$ obtained from the second sensor $S_2$. The input set of sampled values 403 further includes a third sampled value $SV_3$ obtained from the third sensor $S_3$. The input set of sampled values 403 further includes a fourth sampled value $SV_4$ obtained from the fourth sensor $S_4$.

In this example, an output set of sampled values 404 includes the first sampled value $SV_1$. The output set of sampled values 404 further includes the second sampled value $SV_2$. The output set of sampled values 404 further includes the third sampled value $SV_3$. The output set of sampled values 404 further includes the fourth sampled value $SV_4$.

In this example, the input set of sampled values 403 and the output set of sampled values 404 are both arranged in the form of an array of sampled values.

In this example, the input set of sampled values 403 is arranged as a matrix with four rows and one column. In this example, the sampled value in the first position in the input set of sampled values 403 is the sampled value in the first row and first column of the input set of sampled values 403. In this example, the sampled value in the second position in the input set of sampled values 403 is the sampled value in the second row and first column of the input set of sampled values 403. In this example, the sampled value in the third position in the input set of sampled values 403 is the sampled value in the third row and first column of the input set of sampled values 403. In this example, the sampled value in the fourth position in the input set of sampled values 403 is the sampled value in the fourth row and first column of the input set of sampled values 403.

In this example, the output set of sampled values 404 is arranged as a matrix with two rows and two columns. In this example, the number of sampled values in the output set of sampled values 404 is the same as the number of sampled values in the input set of sampled values 403, namely four. However, the arrangement of the sampled values is different in the output set of sampled values 404 compared to that in the input set of sampled values 403. In this example, the sampled value in the first position in the output set of sampled values 404 is the sampled value in the first row and first column of the output set of sampled values 404. In this example, the sampled value in the second position in the output set of sampled values 404 is the sampled value in the first row and second column of the output set of sampled values 404. In this example, the sampled value in the third position in the output set of sampled values 404 is the sampled value in the second row and first column of the output set of sampled values 404. In this example, the sampled value in the fourth position in the output set of sampled values 404 is the sampled value in the second row and second column of the output set of sampled values 404.

In this example, the mapper 402 has access to a database 405. The database 405 stores data comprising comprises at least one mapping rule.

A mapping rule defines a correspondence between a position of a given sampled value $SV_1$, $SV_2$, $SV_3$, $SV_4$ in the input set of sampled values 403 and the position of the given sampled value $SV_1$, $SV_2$, $SV_3$, $SV_4$ in the output set of sampled values 404.

As such, a mapping rule relates data derived from output data obtained from a given sensor in the plurality of sensors to the identity of the given sensor. A mapping rule may be used to exploit statistical correlation between different sensors in the plurality of sensors, for example by arranging data derived from the different sensors according to such a mapping rule. By exploiting correlation between different sensors, efficiency of coding the data derived from sensor output data may be improved. Coding efficiency may be particularly improved in cases where there are a relatively large number of sensors, for example in an aircraft.

In this example, the mapper 402 is configured to determine a position of a given sampled value $SV_1$, $SV_2$, $SV_3$, $SV_4$ in the output set of sampled values 404 based on the mapping rule.

In this example, the mapping rule is configured so that the position of a given sampled value $SV_1$, $SV_2$, $SV_3$, $SV_4$ in the output set of sampled values 404 is the same as the position of the given sampled value $SV_1$, $SV_2$, $SV_3$, $SV_4$ in the input set of sampled values 403.

In this example, sensors $S_1$, $S_2$, $S_3$, $S_4$ are arranged in a given order. The given order, in this example, is that sensor $S_1$ is a first sensor, sensor $S_2$ is a second sensor, sensor $S_3$ is a third sensor and sensor $S_4$ is a fourth sensor. In this example, the mapping rule is configured to preserve an order of the sampled values $SV_1$, $SV_2$, $SV_3$, $SV_4$ in the output set of sampled values 404 with respect to the given order of the sensors $S_1$, $S_2$, $S_3$, $S_4$ from which they are obtained. It will be appreciated that the order of the sensors $S_1$, $S_2$, $S_3$, $S_4$ may be a logical order rather than a physical order in which the sensors $S_1$, $S_2$, $S_3$, $S_4$ are located, for example in a vehicle. For example, the sensors $S_1$, $S_2$, $S_3$, $S_4$ may be associated with respective sensor identifiers "1", "2", "3", "4" from a lowest sensor identifier "1" to a highest sensor identifier "4" and the order of the sensors $S_1$, $S_2$, $S_3$, $S_4$ is the sensor $S_1$ associated with the lowest sensor identifier "1", followed by the sensor $S_2$ associated with the second-lowest sensor identifier "2" and so on up to the sensor $S_4$ associated with the highest sensor identifier "4". Although an example is provided of numeric sensor identifiers, it will be appreciated that sensors identifiers may take a different form, such as alphanumeric.

In this example, the first sampled value $SV_1$ obtained from the first sensor $S_1$ is in the first position in both the input set of sampled values 403 and the output set of sampled values 404. In this example, the second sampled value $SV_2$ obtained from the second sensor $S_2$ is in the second position in both the input set of sampled values 403 and the output set of sampled values 404. In this example, the third sampled value $SV_3$ obtained from the third sensor $S_3$ is in the third position in both the input set of sampled values 403 and the output set of sampled values 404. In this example, the fourth sampled value $SV_4$ obtained from the fourth sensor $S_4$ is in the fourth position in both the input set of sampled values 403 and the output set of sampled values 404.

In this example, an identity of a given sensor $S_1$, $S_2$, $S_3$, $S_4$ from which a given sampled value $SV_1$, $SV_2$, $SV_3$, $SV_4$ in the output set of sampled values 404 is obtained is determinable solely from a position of the given sampled value $SV_1$, $SV_2$, $SV_3$, $SV_4$ in the output set of sampled values 404. In particular, since, in this example, the mapping rule is configured to preserve an order of the sampled values $SV_1$, $SV_2$, $SV_3$, $SV_4$ in the output set of sampled values 404 with respect to the given order of the sensors $S_1$, $S_2$, $S_3$, $S_4$ from which they are obtained, it can be determined, solely from the position of a given sampled value $SV_1$, $SV_2$, $SV_3$, $SV_4$ in the output set of sampled values 404 an identity of a given sensor $S_1$, $S_2$, $S_3$, $S_4$ from which the given sampled value $SV_1$, $SV_2$, $SV_3$, $SV_4$ is obtained.

For example, it may be determined that the first sampled value $SV_1$ is obtained from the first sensor $S_1$ solely on the basis that the first sampled value $SV_1$ is in the first position in the output set of sampled values 404. It may also be determined that the second sampled value $SV_2$ is obtained from the second sensor $S_2$ solely on the basis that the second sampled value $SV_2$ is in the second position in the output set of sampled values 404. It may also be determined that the third sampled value $SV_3$ is obtained from the third sensor $S_3$ solely on the basis that the third sampled value $SV_3$ is in the third position in the output set of sampled values 404. It may also be determined that the fourth sampled value $SV_4$ is obtained from the fourth sensor $S_4$ solely on the basis that the fourth sampled value $SV_4$ is in the fourth position in the output set of sampled values 404.

This type of mapping rule is referred to herein as a "fixed" mapping rule. In a mapping using the fixed mapping rule, the position of a sampled value $SV_1$, $SV_2$, $SV_3$, $SV_4$ in a set of sampled values directly relates to the identity of the sensor $S_1$, $S_2$, $S_3$, $S_4$ from which the sampled value $SV_1$, $SV_2$, $SV_3$, $SV_4$ is obtained. For example, using the fixed mapping rule, it can be directly determined that the sampled value $SV_1$ in the first position in the output set of sampled values 404 is obtained from the first sensor $S_1$, the sampled value $SV_2$ in the second position in the output set of sampled values 404 is obtained from the second sensor $S_2$, the sampled value $SV_3$ in the third position in the output set of sampled values 404 is obtained from the third sensor $S_3$, and the sampled value $SV_4$ in the fourth position in the output set of sampled values 404 is obtained from the fourth sensor $S_4$.

Although, in this example, the input data 403 has been described as comprising sampled values $SV_1$, $SV_2$, $SV_3$, $SV_4$, the mapper 402 may alternatively or additionally be used to map input data comprising a set of data elements to output data comprising a set of data elements.

Figure 5:
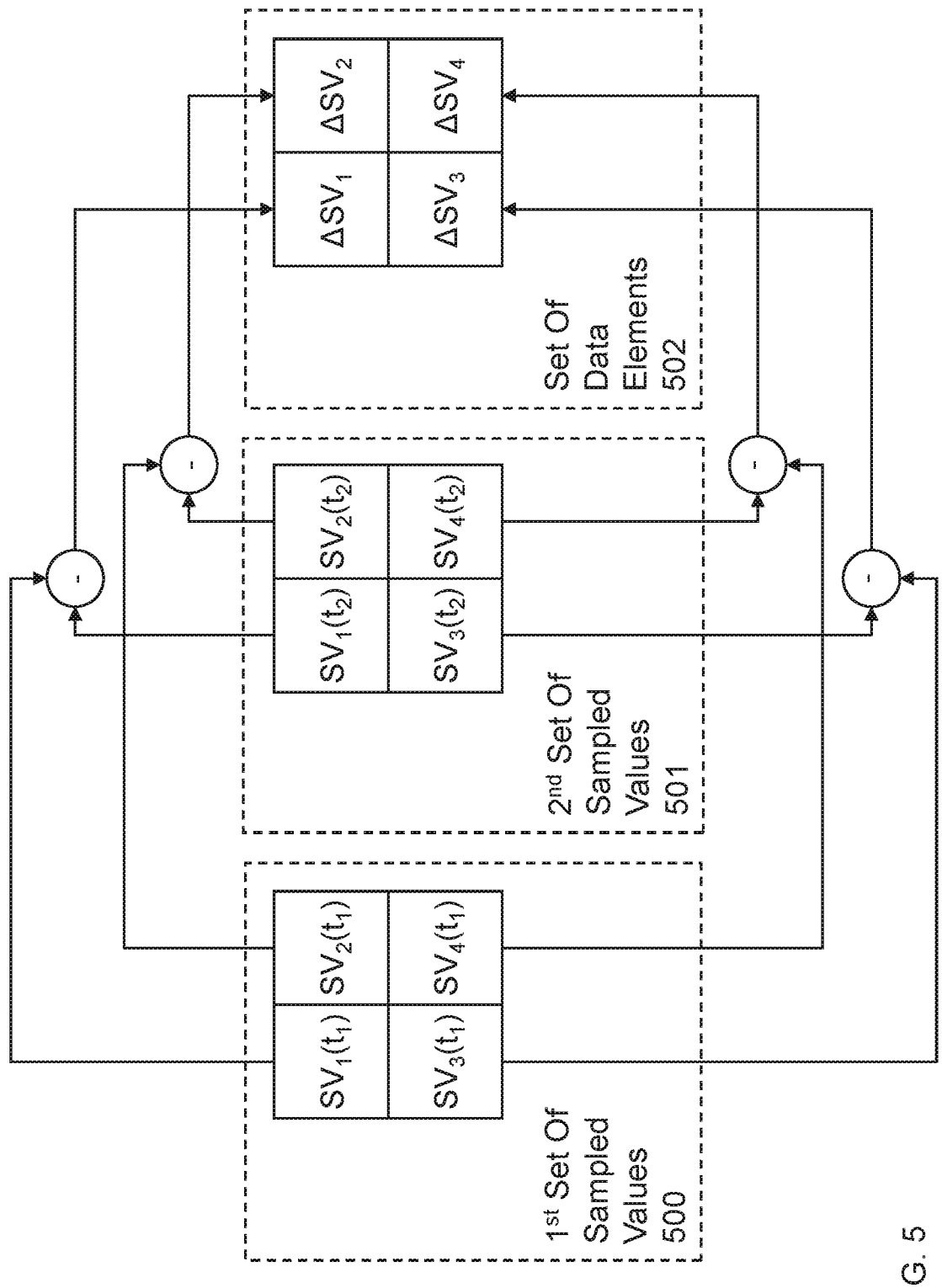
FIG. 5 shows schematically an illustration of an example of a method of processing telemetry data in accordance with an embodiment of the present invention.

Referring to FIG. 5, there is shown schematically an illustration of an example of a method of processing telemetry data.

A sampled value obtained from a sensor having an identity "i" in the plurality of sensors at a $k^{th}$ sampling time is denoted $SV_i(t_k)$. A data element indicative of a measure of a change between a sampled value obtained from a sensor having an identity "i" at a $k^{th}$ sampling time and a sampled value obtained from the $i^{th}$ sensor at the $k+1^{st}$ sampling time is denoted $\Delta SV_i$.

A first set of sampled values 500 is arranged as an array. In this example, the first set of sampled values 500 is arranged as a two-dimensional array having two rows and two columns. The first set of sampled values 500 includes a first sampled value, $SV_1(t_1)$, obtained from a first sensor $S_1$ at a first sampling time, $t_1$. The first set of sampled values 500 further includes a second sampled value, $SV_1(t_1)$, obtained from a second sensor $S_2$ at the first sampling time, $t_1$. The first set of sampled values 500 further includes a third sampled value, $SV_1(t_1)$, obtained from a third sensor $S_3$ at the first sampling time, $t_1$. The first set of sampled values 500 further includes a fourth sampled value, $SV_1(t_1)$, obtained from a fourth sensor $S_4$ at the first sampling time, $t_1$.

A second set of sampled values 501 is arranged as an array. In this example, the second set of sampled values 501 is arranged as a two-dimensional array having two rows and two columns. The second set of sampled values 501 includes a first sampled value, $SV_1(t_2)$, obtained from the first sensor $S_1$ at a second sampling time, $t_2$. The second set of sampled values 501 further includes a second sampled value, $SV_2(t_2)$, obtained from the second sensor $S_2$ at the second sampling time, $t_2$. The second set of sampled values 501 further includes a third sampled value, $SV_3(t_2)$, obtained from the third sensor $S_3$ at the second sampling time, $t_2$. The second set of sampled values 501 further includes a fourth sampled value, $SV_4(t_2)$, obtained from the fourth sensor $S_4$ at the second sampling time, $t_2$.

A set of data elements 502 is arranged as an array. In this example, the set of data elements 502 is arranged as a two-dimensional array having two rows and two columns. The set of data elements 502 includes a first data element, $\Delta SV_1$, indicative of a measure of a change between the sampled value, $SV_1(t_1)$, obtained from the first sensor $S_1$ at the first sampling time, $t_1$, and the sampled value, $SV_1(t_2)$, obtained from the first sensor $S_1$ at the second sampling time, $t_2$. The set of data elements 502 further includes a second data element, $\Delta SV_2$, indicative of a measure of a change between the sampled value, $SV_2(t_1)$, obtained from the second sensor $S_2$ at the first sampling time, $t_1$, and the sampled value, $SV_2(t_2)$, obtained from the second sensor $S_2$ at the second sampling time, $t_2$. The set of data elements 502 further includes a third data element, $\Delta SV_3$, indicative of a measure of a change between the sampled value, $SV_3(t_1)$, obtained from the third sensor $S_3$ at the first sampling time, $t_1$, and the sampled value, $SV_3(t_2)$, obtained from the third sensor $S_3$ at the second sampling time, $t_2$. The set of data elements 502 further includes a fourth data element, $\Delta SV_4$, indicative of a measure of a change between the sampled value, $SV_4(t_1)$, obtained from the fourth sensor $S_4$ at the first sampling time, $t_1$, and the sampled value, $SV_4(t_2)$, obtained from the fourth sensor $S_4$ at the second sampling time, $t_2$.

In this example, the first set of sampled values 500, the second set of sampled values 501 and the set of data elements 502 is each arranged to create a virtual plane of sampled values or data elements. In this example, the virtual plane is a two-dimensional plane. However, the sampled values or data elements could be arranged in an array, or a virtual plane or arrangement, having more than two dimensions.

In this example, the first set of sampled values 500, the second set of sampled values 501, and the set of data elements 502 are arranged as the same type of array, namely in the form of a 2×2 matrix.

Figure 6:
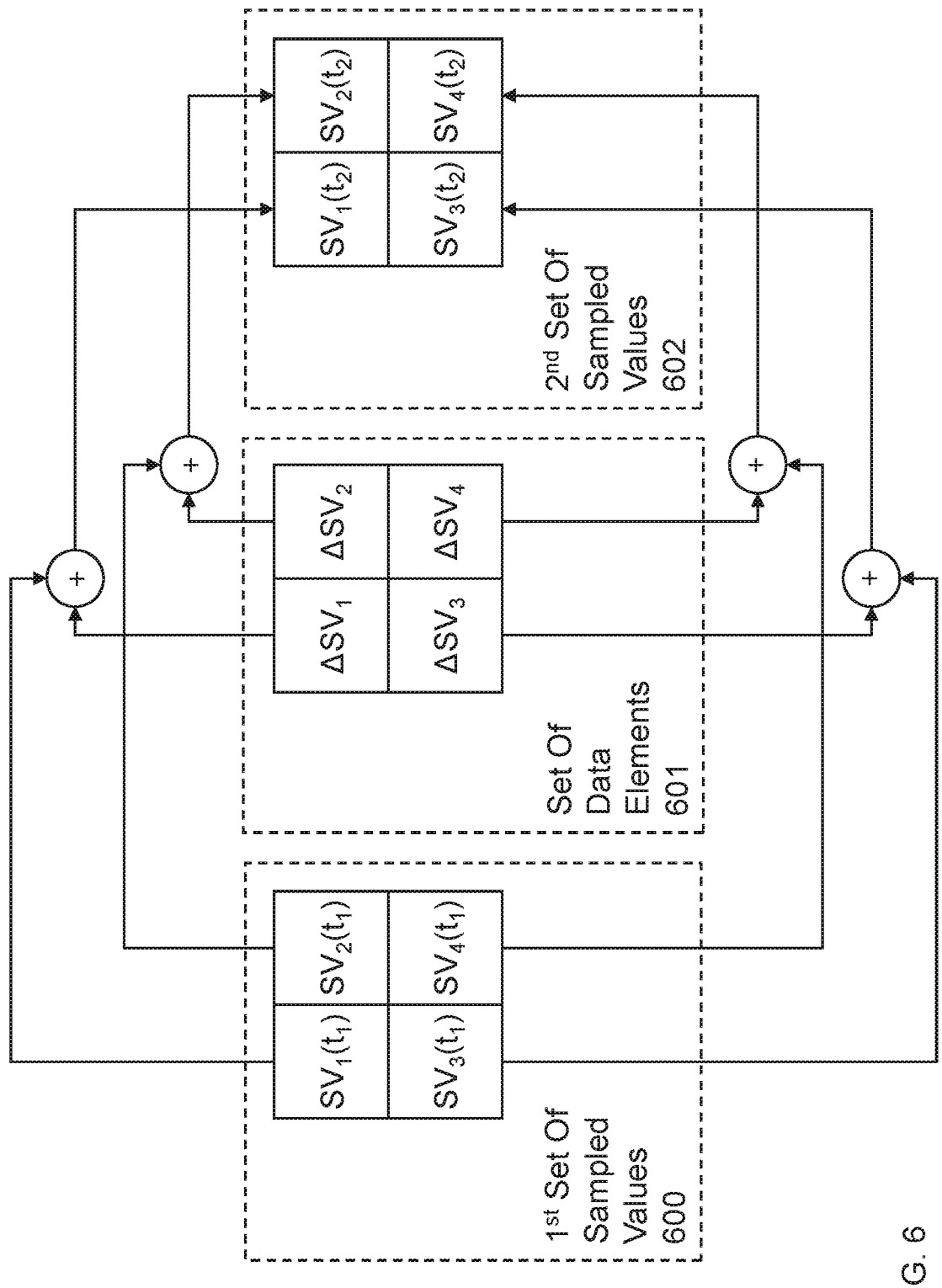
FIG. 6 shows schematically an illustration of an example of a method of processing telemetry data in accordance with an embodiment of the present invention.

Referring to FIG. 6, there is shown schematically an illustration of an example of a method of processing telemetry data.

In this example, a remote data processing unit has received a first set of sampled values 600 and a set of data elements 601 from a data processing device. The remote data processing unit has decoded and/or decrypted the received data as needed.

The remote data processing unit is able to recover a second set of sampled values 602 using the received first set of sampled values 600 and the received set of data elements 601. In this example, the remote data processing unit does not receive the second set of sampled values 602 or an encoded version of the second set of sampled values 602 from the data processing device, but uses the received first set of sampled values 600 and the received set of data elements 601 to recover the second set of sampled values 602.

The remote data processing unit recovers the sampled value, $SV_1(t_2)$, obtained from the first sensor $S_1$ at the second sampling time, $t_2$, by adding the first data element, $\Delta SV_1$, to the sampled value, $SV_1(t_1)$, obtained from the first sensor $S_1$ at the first sampling time, $t_1$. The remote data processing unit recovers the sampled value, $SV_2(t_2)$, obtained from the second sensor $S_2$ at the second sampling time, $t_2$, by adding the second data element, $\Delta SV_2$, to the sampled value, $SV_2(t_1)$, obtained from the second sensor $S_2$ at the first sampling time, $t_1$. The remote data processing unit recovers the sampled value, $SV_3(t_2)$, obtained from the third sensor $S_3$ at the second sampling time, $t_2$, by adding the third data element, $\Delta SV_3$, to the sampled value, $SV_3(t_1)$, obtained from the third sensor $S_3$ at the first sampling time, $t_1$. The remote data processing unit recovers the sampled value, $SV_4(t_2)$, obtained from the fourth sensor $S_4$ at the second sampling time, $t_2$, by adding the fourth data element, $\Delta SV_4$, to the sampled value, $S_4(t_1)$, obtained from the fourth sensor $S_4$ at the first sampling time, $t_1$.

It can be seen from the examples described above with reference to FIGS. 5 and 6 that the differences between the sampled values in the first set of values and the second set of sampled values are not treated as random noise between subsequent sampling times, but rather as data that is recorded and used by the remote data processing unit to obtain the second set of sampled values. This represents a difference over at least some existing image compression techniques, which would see the variations between the sampled values in the first and second sets of sampled values as random noise rather than as data to be recorded and to be used to obtain the second set of sampled values. Existing compression algorithms would instead likely ignore such variations. This is because the variations are likely to be small, and because existing compression algorithms may be optimized to minimize inter-frame compression, for example variations between frames, based on moving objects in a video sequence.

Accordingly, intra-frame only encoding, in which each set of sampled values is encoded separately, may be used if existing image compression algorithms were to be used. This, for known image compression algorithms, would mean encoding each set of sampled values fully and transmitting the encoded sets of sampled values to the remote data processing unit.

In contrast, in accordance with examples described herein, such variations between the sampled values in the first and second sets of sampled values are encoded and output for transmission to the remote data processing unit. In some examples, the second set of sampled values is not output for transmission to the remote data processing unit. The first set of sampled values may be encoded using a hierarchical encoding technique, for example as described below with reference to FIGS. 17 and 18, or using another, for example an existing, encoding technique. However, for the subsequent data to be encoded, namely the set of data elements, the subsequent data may be seen as an "enhancement" layer over a "base" layer corresponding to the first set of sampled values. The sequence of snapshots of the sampled values at different times may be seen as different layers in a hierarchical encoding architecture. For example, an initial snapshot may be seen as an initial base layer and one or more further snapshots may be seen as one or more enhancement layers of the base layer. This allows the application of a hierarchical approach over this sequence of snapshots. Where a hierarchical approach is used for encoding video data, each image in the video sequence may have a base layer and one or more enhancement layers. In other words, in such a hierarchical approach for encoding video data, each enhancement layer is a spatial enhancement of the base layer, namely it enhances the image over the same space at a fixed instant. By applying such a hierarchical encoding technique to the present scenario, temporal enhancement may be applied in relation to the base layer, namely corresponding to the measures of difference between a snapshot and one or more previous snapshots as if it was equivalent to a spatial enhancement. When a decoder decodes and combines the base layer—the first set of data elements—and the enhancement layer—the set of data elements—it would obtain the decoded second set of sampled values at the second sampling time. This may represent a significant saving in terms of the amount of data to be encoded, since the first set of sampled values could be fully encoded and then only an enhancement layer, corresponding to a set of data elements, for the next set or sets of sampled values could be encoded. This may result in the same outcome as if each set of sampled values had been encoded individually, namely that the remote data processing unit can recover the sets of sampled values, but with a reduction in the amount of data that is encoded and transmitted to be able to do so.

Figure 7:
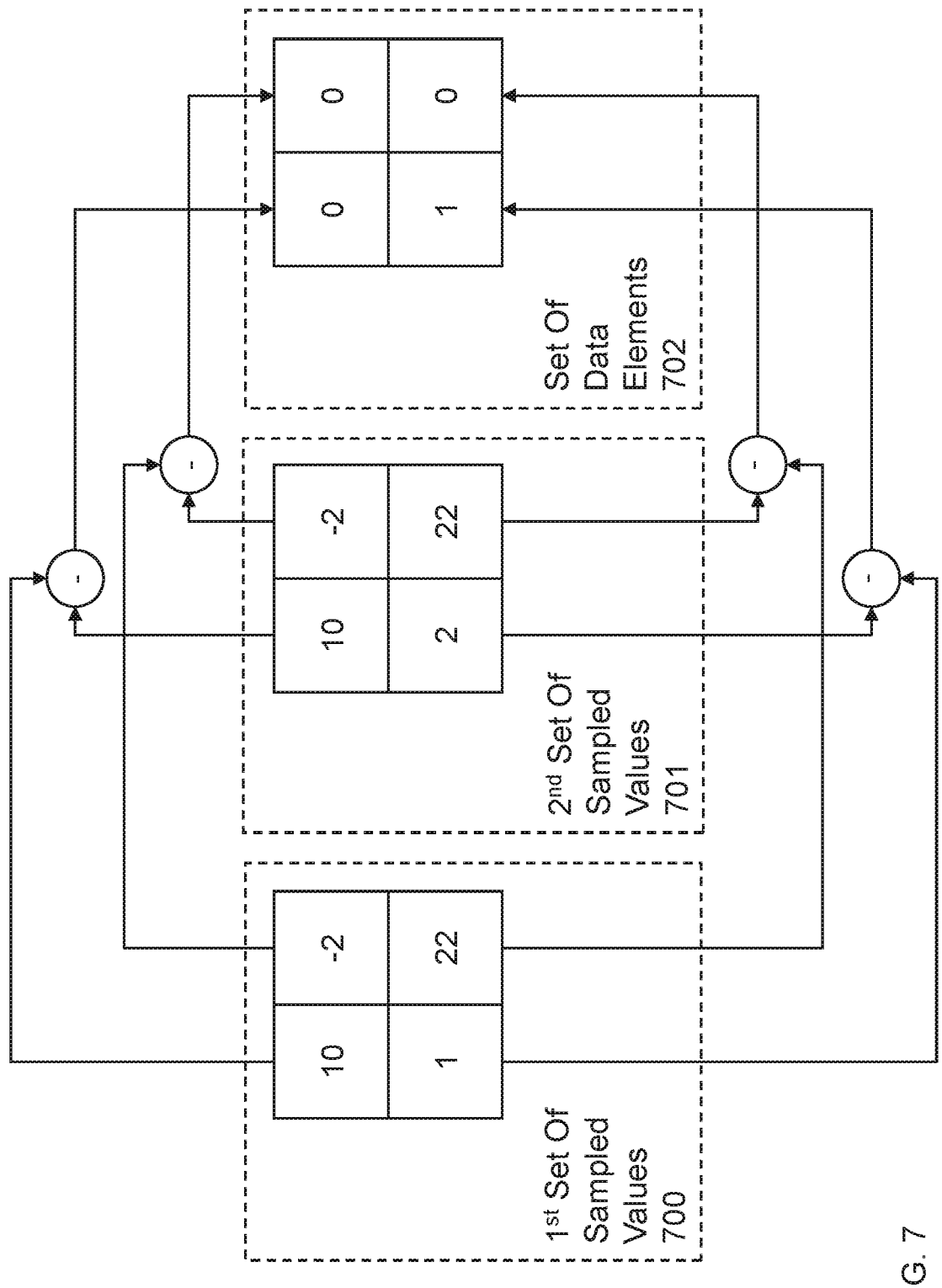
FIG. 7 shows schematically an illustration of an example of a method of processing telemetry data in accordance with an embodiment of the present invention.

Referring to FIG. 7, there is shown schematically an illustration of an example of a method of processing telemetry data.

The schematic illustration in FIG. 7 corresponds to the schematic illustration shown in FIG. 5. However, FIG. 7 indicates sampled values and data elements based on the examples shown in FIGS. 2 and 3, and the example of the fixed mapping rule described above with reference to FIG. 4.

A first set of sampled values 700 is arranged as an array. In this example, the first set of sampled values 700 is arranged as a two-dimensional array having two rows and two columns. The first set of sampled values 700 includes a first sampled value, "10", obtained from the first sensor $S_1$ at the first sampling time, $t_1$. The first set of sampled values 700 further includes a second sampled value, "−2", obtained from the second sensor $S_2$ at the first sampling time, $t_1$. The first set of sampled values 700 further includes a third sampled value, "1", obtained from the third sensor $S_3$ at the first sampling time, $t_1$. The first set of sampled values 700 further includes a fourth sampled value, "22", obtained from the fourth sensor $S_4$ at the first sampling time, $t_1$.

A second set of sampled values 701 is arranged as an array. In this example, the second set of sampled values 701 is arranged as a two-dimensional array having two rows and two columns. The second set of sampled values 701 includes a first sampled value, "10", obtained from the first sensor $S_1$ at the second sampling time, $t_2$. The second set of sampled values 701 further includes a second sampled value, "−2", obtained from the second sensor $S_2$ at the second sampling time, $t_2$. The second set of sampled values 701 further includes a third sampled value, "2", obtained from the third sensor $S_3$ at the second sampling time, $t_2$. The second set of sampled values 701 further includes a fourth sampled value, "22", obtained from the fourth sensor $S_4$ at the second sampling time, $t_2$.

A set of data elements 702 is arranged as an array. In this example, the set of data elements 702 is arranged as a two-dimensional array having two rows and two columns. The set of data elements 702 includes a first data element, "0", indicative of a measure of a change between the sampled value, "10", obtained from the first sensor $S_1$ at the first sampling time, $t_1$, and the sampled value, "10", obtained from the first sensor $S_1$ at the second sampling time, $t_2$. The set of data elements 702 further includes a second data element, "0", indicative of a measure of a change between the sampled value, "−2", obtained from the second sensor $S_2$ at the first sampling time, $t_1$, and the sampled value, "−2", obtained from the second sensor $S_2$ at the second sampling time, $t_2$. The set of data elements 702 further includes a third data element, "1", indicative of a measure of a change between the sampled value, "1", obtained from the third sensor $S_3$ at the first sampling time, $t_1$, and the sampled value, "2", obtained from the third sensor $S_3$ at the second sampling time, $t_2$. The set of data elements 702 further includes a fourth data element, "0", indicative of a measure of a change between the sampled value, "22", obtained from the fourth sensor $S_4$ at the first sampling time, $t_1$, and the sampled value, "22", obtained from the fourth sensor $S_4$ at the second sampling time, $t_2$.

It can readily be seen that the amount of data required to transmit the first set of sampled values 700 and the set of data elements 702 is less than the amount of data required to transmit the first set of sampled values 700 and the second set of sampled values 701. For example, the first set of sampled values 700 may require $4*2^5=128$ bits, assuming each sampled value is represented using $2^5=32$ bits, the second set of sampled values 701 may require $4*2^5=128$ bits, assuming each sampled value is represented using $2^5=32$ bits, and the set of data elements 702 may require $4*2^1=8$ bits, assuming each data element is represented using $2^1=2$ bits. Transmitting both the first set of sampled values 700 and the second set of sampled values 701 would require 128+128=256 bits, whereas transmitting the first set of sampled values 700 and the set of data elements 702 would require only 128+8=136 bits.

The amount of data to be transmitted can be reduced further by encoding the first set of sampled values 700 and/or the set of data elements 702 prior to transmission, as described in detail herein. Where the changes between the sampled values from a sensor are zero or are relatively small between the first sampling time, $t_1$, and the second sampling time, $t_2$, the values of the data elements in the set of data elements 702 are also zero or are relatively small values. This can allow efficient encoding of the set of data elements 702 and therefore relatively high compression rates, particularly compared to techniques in which the first set of sampled values 700 and the second set of sampled values 701 are both encoded and transmitted to the remote data processing unit.

In this example, the first set of sampled values 700, the second set of sampled values 701 and the set of data elements 702 are arranged as a same type of array, namely in the form of 2×2 matrices.

It can readily be seen from this example that the amount of data transmitted from a data processing device to a remote data processing unit depends on various different factors. One factor is the number of sensors for which data is being reported. Another factor is the size of the sampled values. Another factor is the type of encoding technique used. Another factor is the extent to which the output data from the sensors changes between sampling times.

As a consequence, the bit rate of the data transmitted from the data processing device to the remote data processing unit may be variable. For example, where the changes of sampled values between different sampling times are zero or relatively small, the amount of data transmitted may be relatively low and where the changes of sampled values between different sampling times are relatively high, the amount of data transmitted may be relatively high.

In some examples, one or more known characteristics of a communication channel between the data processing device and the remote data processing unit is used to constrain or define at least one of those factors affecting the bit rate of the transmitted data. Examples of the known characteristic include, but are not limited to, the capacity of the communication channel and the cost of sending data via the communication channel.

In some examples, the one or more known characteristics of the communication channel are used to determine at least one feature of an encoding technique used to encode the set of data elements. Examples of the at least one feature include, but are not limited to, complexity, compression rate, encoding technique, amount of acceptable information loss during encoding etc.

Figure 8:
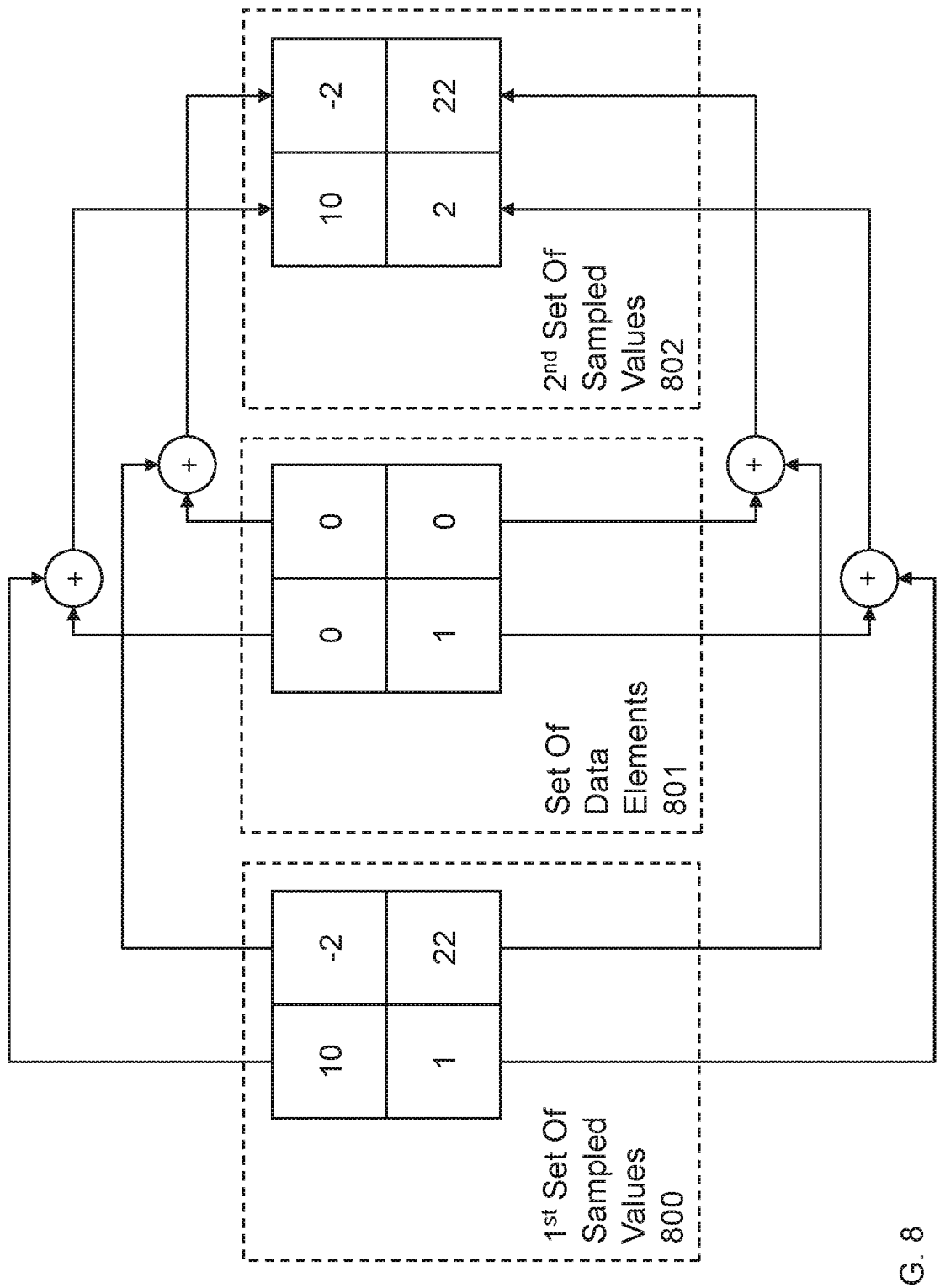
FIG. 8 shows schematically an illustration of an example of a method of processing telemetry data in accordance with an embodiment of the present invention.

Referring to FIG. 8, there is shown schematically an illustration of an example of a method of processing telemetry data.

The illustration in FIG. 8 corresponds to the illustration shown in FIG. 6. However, FIG. 8 indicates sampled values and data elements based on the examples shown in FIGS. 2 and 3 the example of the fixed mapping rule described above with reference to FIG. 4.

In this example, a remote data processing unit has received a first set of sampled values 800 and a set of data elements 801 from a data processing device. The remote data processing unit has decoded and/or decrypted the received data as needed.

The remote data processing unit is able to recover a second set of sampled values 802 using the received first set of sampled values 800 and the received set of data elements 801. In this example, the remote data processing unit does not receive the second set of sampled values 802 or an encoded version of the second set of sampled values 802 from the data processing device, but uses the received first set of sampled values 800 and the received set of data elements 801 to recover the second set of sampled values 802.

The remote data processing unit recovers the sampled value, "10", obtained from the first sensor $S_1$ at the second sampling time, $t_2$, by adding the first data element value, "0", to the sampled value, "10", obtained from the first sensor $S_1$ at the first sampling time, $t_1$. The remote data processing unit recovers the sampled value, "−2", obtained from the second sensor $S_2$ at the second sampling time, $t_2$, by adding the second data element value, "0", to the sampled value, "−2", obtained from the second sensor $S_2$ at the first sampling time, $t_1$. The remote data processing unit recovers the sampled value, "2", obtained from the third sensor $S_3$ at the second sampling time, $t_2$, by adding the third data element value, "1", to the sampled value, "1", obtained from the third sensor $S_3$ at the first sampling time, $t_1$. The remote data processing unit recovers the sampled value, "22", obtained from the fourth sensor $S_4$ at the second sampling time, $t_2$, by adding the fourth data element value, "0", to the sampled value, "22", obtained from the fourth sensor $S_4$ at the first sampling time, $t_1$.

Figure 9:
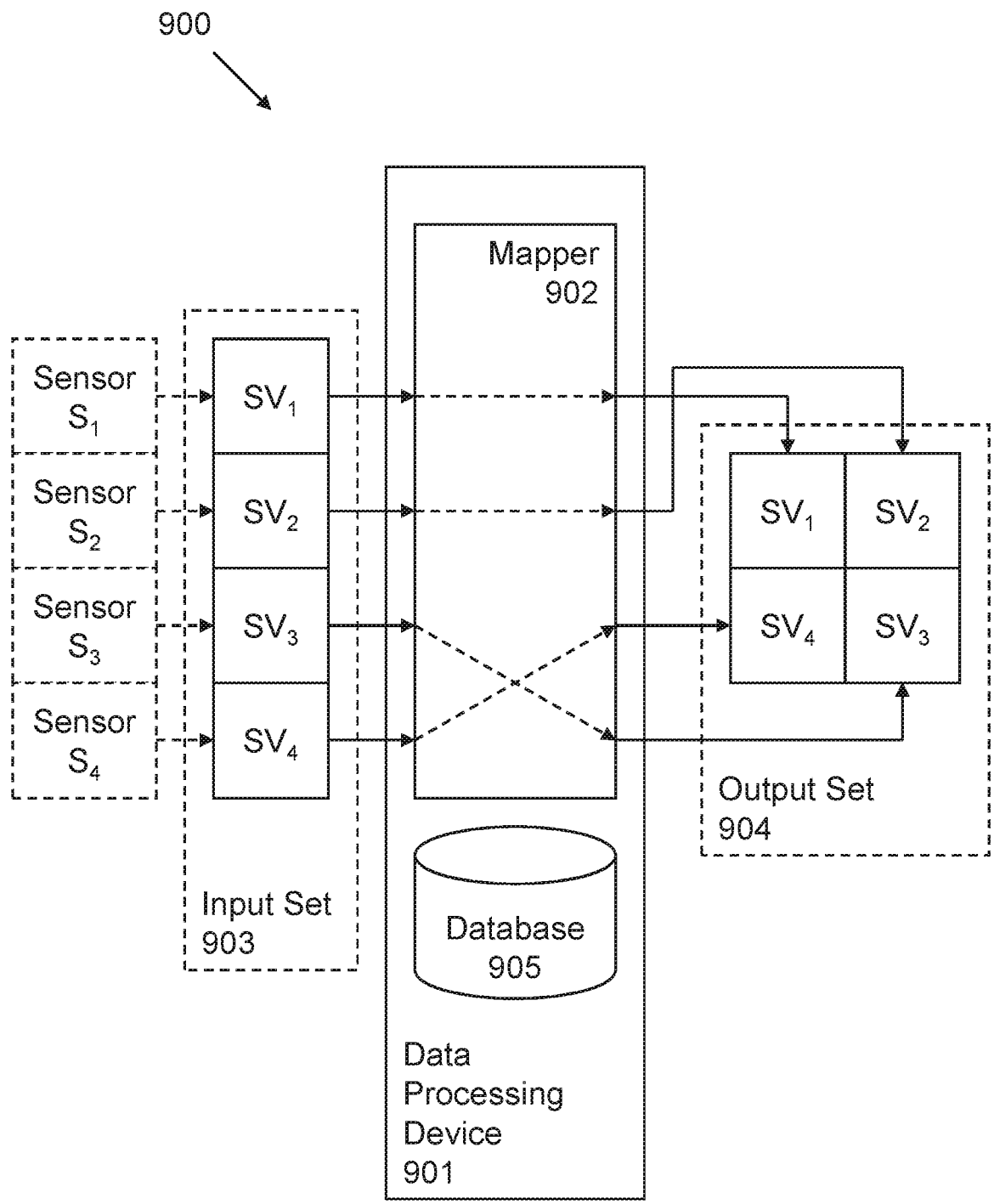
FIG. 9 shows a schematic block diagram of an example of a data processing system in accordance with an embodiment of the present invention.

Referring to FIG. 9, there is shown a schematic block diagram of an example of a data processing system 900. The data processing system 900 is substantially the same as the data processing system 400 described above with reference to FIG. 4 and corresponding entities are shown in FIG. 9 using the same reference numeral as in FIG. 4 but incremented by 500. However, compared to data processing system 400 described above with reference to FIG. 4, a different mapping rule is used in this example and the position of the sampled values $SV_1$, $SV_2$, $SV_3$, $SV_4$ in the output set of sampled values 904 is different.

In this example, the mapping rule is configured so that the position of a given sampled value $SV_1$, $SV_2$, $SV_3$, $SV_4$ in the output set of sampled values 904 is allowed to be different from the position of the given sampled value $SV_1$, $SV_2$, $SV_3$, $SV_4$ in the input set of sampled values 903.

In this example, the first sampled value $SV_1$ obtained from the first sensor $S_1$ is in the first position in both the input set of sampled values 903 and the output set of sampled values 904. In this example, the second sampled value $SV_2$ obtained from the second sensor $S_2$ is in the second position in both the input set of sampled values 903 and the output set of sampled values 904. In this example, the third sampled value $SV_3$ obtained from the third sensor $S_3$ is in the third position in the input set of sampled values 903 but is in the fourth position in the output set of sampled values 904. In this example, the fourth sampled value $SV_4$ obtained from the fourth sensor $S_4$ is in the fourth position in the input set of sampled values 903 but is in the third position in the output set of sampled values 904.

In this example, an identity of a given sensor $S_1$, $S_2$, $S_3$, $S_4$ from which a given sampled value $SV_1$, $SV_2$, $SV_3$, $SV_4$ in the output set of sampled values 904 is obtained is indeterminable solely from a position of the given sampled value $SV_1$, $SV_2$, $SV_3$, $SV_4$ in the output set of sampled values 904.

In particular, since, in this example, the mapping rule is configured to allow an order of the sampled values $SV_1$, $SV_2$, $SV_3$, $SV_4$ in the output set of sampled values 904 to be different from the given order of the sensors $S_1$, $S_2$, $S_3$, $S_4$ from which they are obtained, it cannot be determined, solely from the position of a given sampled value $SV_1$, $SV_2$, $SV_3$, $SV_4$ in the output set of sampled values 904, an identity of a given sensor $S_1$, $S_2$, $S_3$, $S_4$ from which the given sampled value $SV_1$, $SV_2$, $SV_3$, $SV_4$ is obtained.

For example, the sampled value $SV_3$ obtained from the third sensor $S_3$ is in the fourth position in the output set of sampled values 904. Further, the sampled value $SV_4$ obtained from the fourth sensor $S_4$ is in the third position in the output set of sampled values 904.

In this example, the data processing device 901 is configured to output, for transmission to a remote data processing unit, correlation data associating the given sampled values $SV_1$, $SV_2$, $SV_3$, $SV_4$ in the output set of sampled values 904 with the given sensors $S_1$, $S_2$, $S_3$, $S_4$ from which they are obtained. The correlation data may, for example, be included in header information in data transmitted to the remote data processing unit.

In such examples, a sensor identifier of a given sensor from which a given sampled value is obtained is associated with the given sampled value in the correlation data. The correlation data allows the given sensor from which the given sampled value is obtained to be determined, since the sensor identity is indeterminable based solely on knowing a position of the given sampled value in the output set of sampled values 904.

In this example, the mapper 902 is configured to determine a position for at least some sampled values $SV_1$, $SV_2$, $SV_3$, $SV_4$ in the output set of sampled values 904 based on a measure of a variation of the output data from the sensors $S_1$, $S_2$, $S_3$, $S_4$ from which they are obtained.

In this example, sampled values $SV_1$, $SV_2$, $SV_3$, $SV_4$ obtained from sensors $S_1$, $S_2$, $S_3$, $S_4$ whose output data changes relatively frequently, compared to sensors $S_1$, $S_2$, $S_3$, $S_4$ whose output data changes relatively infrequently, are grouped together in the output set of sampled values 904. In this example, and with reference to FIG. 2, it can be seen that the output, $O(S_3)$, of the third sensor $S_3$ changes relatively frequently compared to the outputs, $O(S_1)$, $O(S_2)$, $O(S_4)$, of the first sensor $S_1$, the second sensor $S_2$ and the fourth sensor $S_4$ respectively. For example, the rate of change of the outputs, $O(S_1)$, $O(S_2)$, $O(S_4)$, of the first sensor $S_1$, the second sensor $S_2$ and the fourth sensor $S_4$ respectively is zero across the time period shown in FIG. 2, whereas the rate of change of the output, $O(S_3)$, of the third sensor $S_3$ is a non-zero, positive value across the time period shown in FIG. 2.

In this example, sampled values $SV_1$, $SV_2$, $SV_3$, $SV_4$ obtained from sensors $S_1$, $S_2$, $S_3$, $S_4$ whose output data changes relatively infrequently compared to sensors $S_1$, $S_2$, $S_3$, $S_4$ whose output data changes relatively frequently are grouped together in the output set of sampled values 904. In this example, and with reference to FIG. 2, it can be seen that the output data, $O(S_1)$, $O(S_2)$, $O(S_4)$, of the first sensor $S_1$, the second sensor $S_2$ and the fourth sensor $S_4$ respectively changes relatively infrequently compared to the output data, $O(S_3)$, of the third sensor $S_3$ across the time period shown in FIG. 2. As such, in this example, the sampled value $SV_3$ obtained from the third sensor $S_3$ is grouped by itself and the sampled values $SV_1$, $SV_2$, $SV_4$ obtained from the first sensor $S_1$, the second sensor $S_2$ and the fourth sensor $S_4$ respectively are grouped together in the output set of sampled values 904.

This type of mapping rule is referred to herein as a "dynamic" mapping rule. In a mapping using the dynamic mapping rule, the sampled values within a set of sampled values are ordered based on at least one criterion other than the identity of the sensor from which they are obtained.

As indicated above, in some examples, such a criterion relates to how frequently the output data from the given sensor $S_1$, $S_2$, $S_3$, $S_4$ changes. In some examples, sampled values from sensors $S_1$, $S_2$, $S_3$, $S_4$ whose output data values change often are mapped so as to be concentrated close to each other in the output set of sampled values 904. By concentrating such sampled values in this way, compression of the output set of sampled values 904 may be improved. This is because clusters of similar sampled values are encoded more efficiently than if they were sparsely dispersed in the output set of sampled values 904.

In an example, sampled values of sensors $S_1$, $S_2$, $S_3$, $S_4$ which are more likely to change frequently than others are mapped to one or more specific areas of the output set of sampled values 904. An assessment of the likelihood of change may be based, for example, on historical sets of data elements, where the data elements are indicative of a measure of a change between a sampled value obtained from a sensor at a first sampling time and a corresponding sampled value obtained from the same sensors at a second sampling time.

In some examples, the mapping rule used by the mapper is allowed to vary over time. For example, the mapper may use a fixed mapping rule for a first mapping time period and a dynamic mapping rule for a second, different time period. In some examples, the data processing device and the remote data processing unit communicate data to indicate which mapping rule is being used. In some examples, an indication of which mapping rule is being used may be implicit in the data transmitted to the remote data processing unit. For example, it may be considered to be implicit that a dynamic mapping rule is being used by the mapper when the remote data processing unit receives correlation data.

Although, in this example, the input data 903 has been described as comprising sampled values $SV_1$, $SV_2$, $SV_3$, $SV_4$, the mapper 902 may alternatively or additionally be used to map input data comprising a set of data elements to output data comprising a set of data elements.

Figure 10:
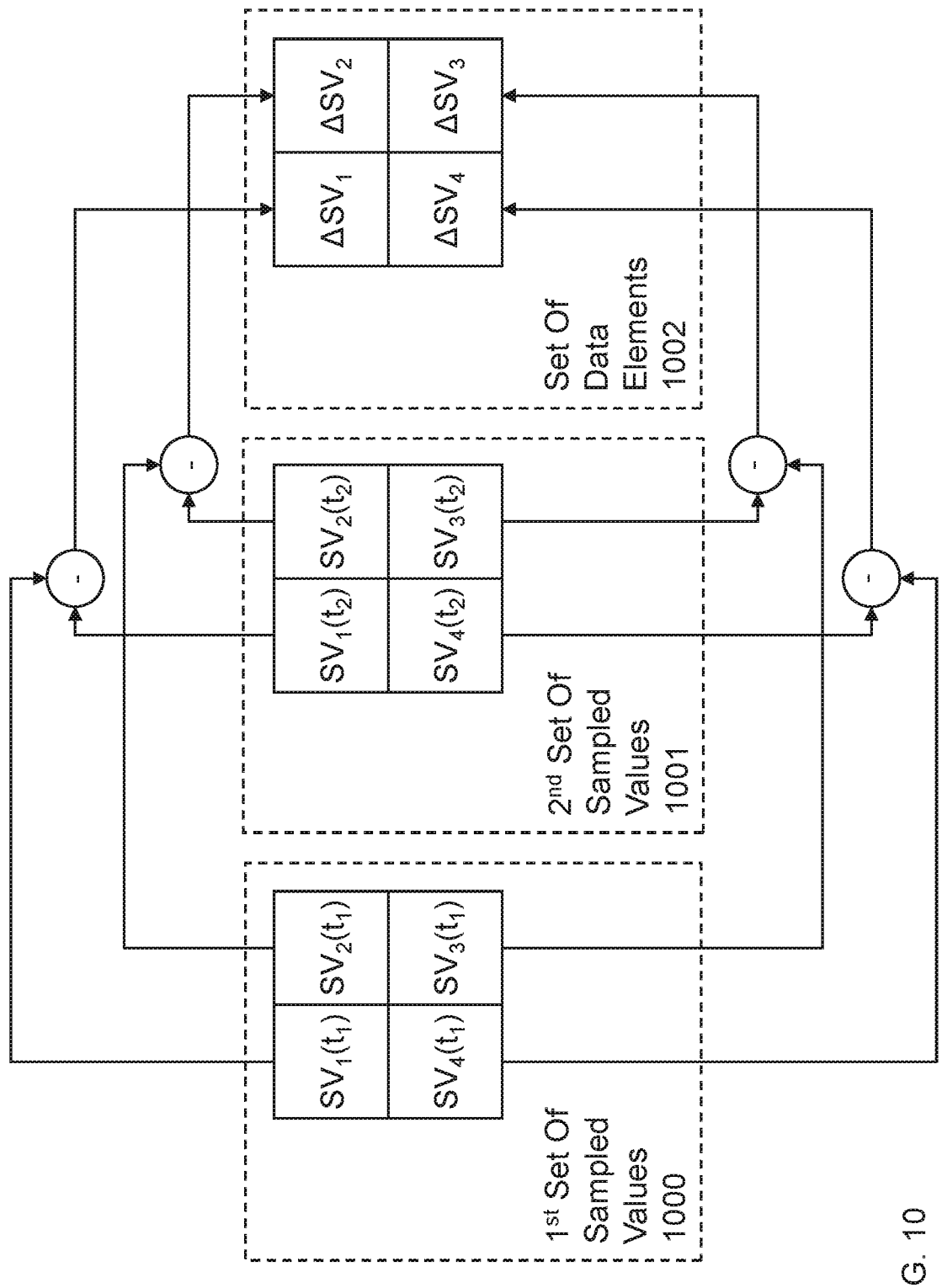
FIG. 10 shows a schematic block diagram of an example of a method of processing telemetry data in accordance with an embodiment of the present invention.

Referring to FIG. 10, there is shown schematically an illustration of an example of a method of processing telemetry data.

A first set of sampled values 1000 is arranged as an array. In this example, the first set of sampled values 1000 is arranged as a two-dimensional array having two rows and two columns. The first set of sampled values 1000 includes a first sampled value, $SV_1(t_1)$, obtained from a first sensor $S_1$ at a first sampling time, $t_1$. The first set of sampled values 1000 further includes a second sampled value, $SV_2(t_1)$, obtained from a second sensor $S_2$ at the first sampling time, $t_1$. The first set of sampled values 1000 further includes a third sampled value, $SV_4(t_1)$, obtained from a fourth sensor $S_4$ at the first sampling time, $t_1$. The first set of sampled values 1000 further includes a fourth sampled value, $SV_3(t_1)$, obtained from a third sensor $S_3$ at the first sampling time, $t_1$.

A second set of sampled values 1001 is arranged as an array. In this example, the second set of sampled values 1001 is arranged as a two-dimensional array having two rows and two columns. The second set of sampled values 1001 includes a first sampled value, $SV_1(t_2)$, obtained from the first sensor $S_1$ at a second sampling time, $t_2$. The second set of sampled values 1001 further includes a second sampled value, $SV_2(t_2)$, obtained from the second sensor $S_2$ at the second sampling time, $t_2$. The second set of sampled values 1001 further includes a third sampled value, $SV_4(t_2)$, obtained from the fourth sensor $S_4$ at the second sampling time, $t_2$. The second set of sampled values 1001 further includes a fourth sampled value, $SV_3(t_2)$, obtained from the third sensor $S_3$ at the second sampling time, $t_2$.

A set of data elements 1002 is arranged as an array. In this example, the set of data elements 1002 is arranged as a two-dimensional array having two rows and two columns. The set of data elements 1002 includes a first data element, $\Delta SV_1$, indicative of a measure of a change between the sampled value, $SV_1(t_1)$, obtained from the first sensor $S_1$ at the first sampling time, $t_1$, and the sampled value, $SV_1(t_2)$, obtained from the first sensor $S_1$ at the second sampling time, $t_2$. The set of data elements 1002 further includes a second data element, $\Delta SV_2$, indicative of a measure of a change between the sampled value, $SV_2(t_1)$, obtained from the second sensor $S_2$ at the first sampling time, $t_1$, and the sampled value, $SV_2(t_2)$, obtained from the second sensor $S_2$ at the second sampling time, $t_2$. The set of data elements 1002 further includes a third data element, $\Delta SV_4$, indicative of a measure of a change between the sampled value, $SV_4(t_1)$, obtained from the fourth sensor $S_4$ at the first sampling time, $t_1$, and the sampled value, $SV_4(t_2)$, obtained from the fourth sensor $S_4$ at the second sampling time, $t_2$.

The set of data elements 1002 further includes a fourth data element, $\Delta SV_3$, indicative of a measure of a change between the sampled value, $SV_3(t_1)$, obtained from the third sensor $S_3$ at the first sampling time, $t_1$, and the sampled value, $SV_3(t_2)$, obtained from the third sensor $S_3$ at the second sampling time, $t_2$.

In this example, the first set of sampled values 1000, the second set of sampled values 1001 and the set of data elements 1002 is each arranged to create a virtual plane of sampled values or data elements. In this example, the virtual plane is a two-dimensional plane. However, the sampled values or data elements could be arranged in an array, or a virtual plane, having more than two dimensions.

In this example, the first set of sampled values 1000, the second set of sampled values 1001, and the set of data elements 1002 are arranged as the same type of array, namely in the form of a 2×2 matrix.

Figure 11:
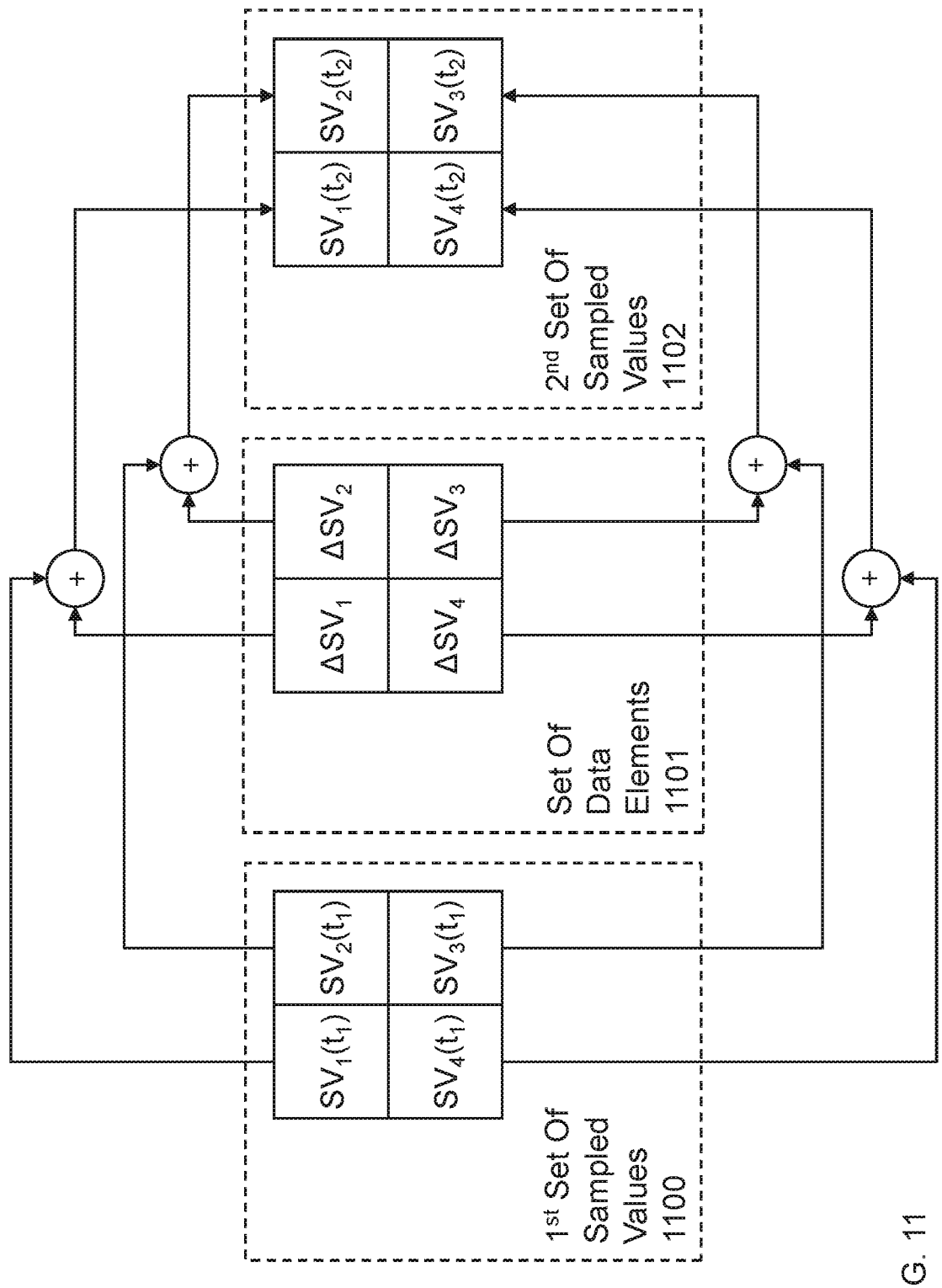
FIG. 11 shows a schematic block diagram of an example of a method of processing telemetry data in accordance with an embodiment of the present invention.

Referring to FIG. 11, there is shown schematically an illustration of an example of a method of processing telemetry data.

In this example, a remote data processing unit has received a first set of sampled values 1100 and a set of data elements 1101 from a data processing device. The remote data processing unit has decoded and/or decrypted the received data as needed.

The remote data processing unit is able to recover a second set of sampled values 1102 using the received first set of sampled values 1100 and the received set of data elements 1101. In this example, the remote data processing unit does not receive the second set of sampled values 1102 or an encoded version of the second set of sampled values 1102 from the data processing device, but uses the received first set of sampled values 1100 and the received set of data elements 1101 to recover the second set of sampled values 1102.

The remote data processing unit recovers the sampled value, $SV_1(t_2)$, obtained from the first sensor $S_1$ at the second sampling time, $t_2$, by adding the first data element, $\Delta SV_1$, to the sampled value, $SV_1(t_1)$, obtained from the first sensor $S_1$ at the first sampling time, $t_1$. The remote data processing unit recovers the sampled value, $SV_2(t_2)$, obtained from the second sensor $S_2$ at the second sampling time, $t_2$, by adding the second data element, $\Delta SV_2$, to the sampled value, $SV_2(t_1)$, obtained from the second sensor $S_2$ at the first sampling time, $t_1$. The remote data processing unit recovers the sampled value, $SV_4(t_2)$, obtained from the fourth sensor $S_4$ at the second sampling time, $t_2$, by adding the third data element, $\Delta SV_4$, to the sampled value, $SV_4(t_1)$, obtained from the fourth sensor $S_4$ at the first sampling time, $t_1$. The remote data processing unit recovers the sampled value, $SV_3(t_2)$, obtained from the third sensor $S_3$ at the second sampling time, $t_2$, by adding the third data element, $\Delta SV_3$, to the sampled value, $S_3(t_1)$, obtained from the third sensor $S_3$ at the first sampling time, $t_1$.

Figure 12:
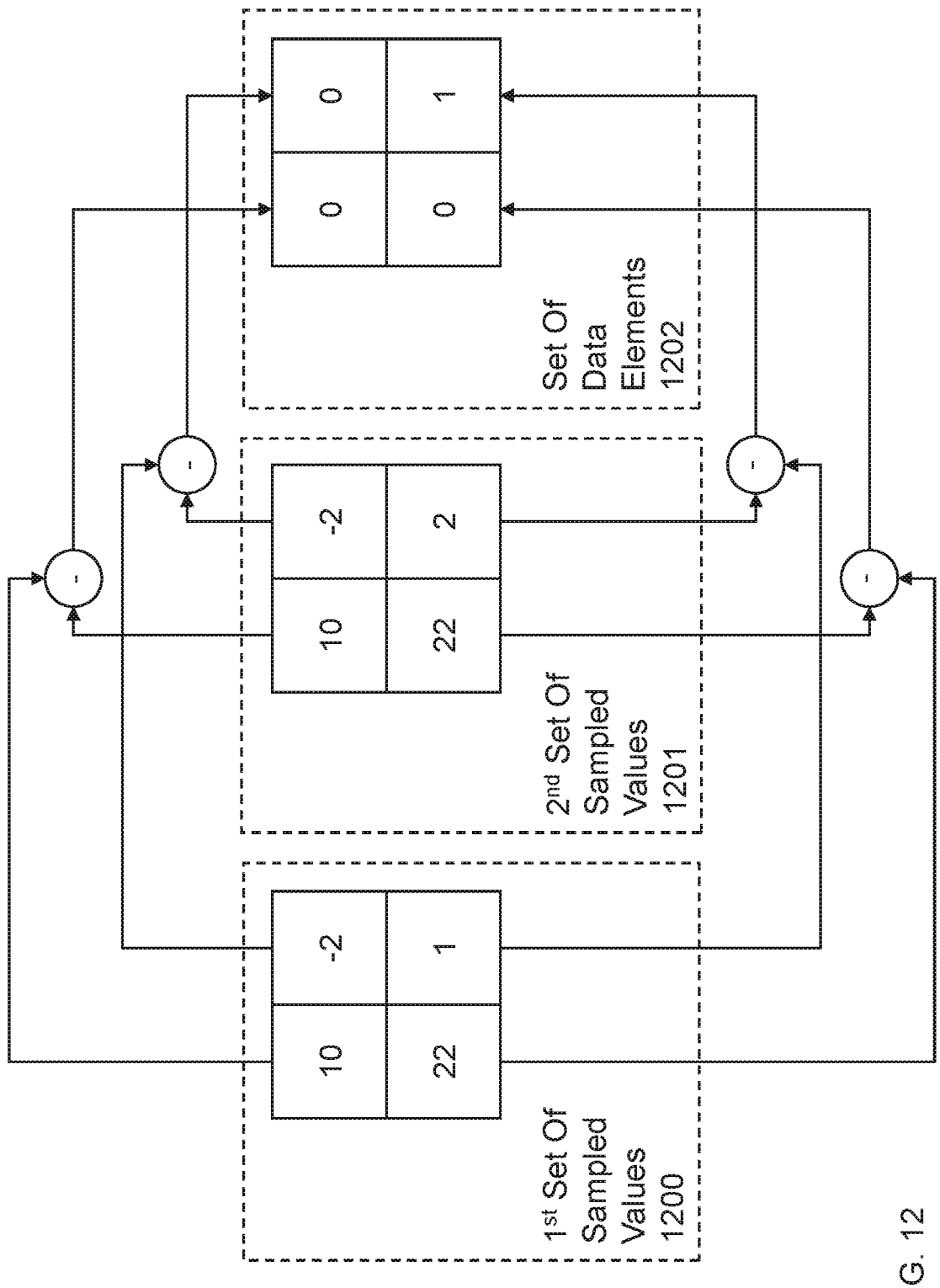
FIG. 12 shows a schematic block diagram of an example of a method of processing telemetry data in accordance with an embodiment of the present invention.

Referring to FIG. 12, there is shown schematically an illustration of an example of a method of processing telemetry data.

The schematic illustration in FIG. 12 corresponds to the schematic illustration shown in FIG. 10. However, FIG. 12 indicates sampled values and data elements based on the examples shown in FIGS. 2 and 3, and the example of the dynamic mapping rule described above with reference to FIG. 9.

A first set of sampled values 1200 is arranged as an array. In this example, the first set of sampled values 1200 is arranged as a two-dimensional array having two rows and two columns. The first set of sampled values 1200 includes a first sampled value, "10", obtained from the first sensor $S_1$ at the first sampling time, $t_1$. The first set of sampled values 1200 further includes a second sampled value, "−2", obtained from the second sensor $S_2$ at the first sampling time, $t_1$. The first set of sampled values 1200 further includes a third sampled value, "22", obtained from the fourth sensor $S_4$ at the first sampling time, $t_1$. The first set of sampled values 1200 further includes a fourth sampled value, "1", obtained from the third sensor $S_3$ at the first sampling time, $t_1$.

A second set of sampled values 1201 is arranged as an array. In this example, the second set of sampled values 1201 is arranged as a two-dimensional array having two rows and two columns. The second set of sampled values 1201 includes a first sampled value, "10", obtained from the first sensor $S_1$ at the second sampling time, $t_2$. The second set of sampled values 1201 further includes a second sampled value, "−2", obtained from the second sensor $S_2$ at the second sampling time, $t_2$. The second set of sampled values 1201 further includes a third sampled value, "22", obtained from the fourth sensor $S_4$ at the second sampling time, $t_2$. The second set of sampled values 1201 further includes a fourth sampled value, "2", obtained from the third sensor $S_3$ at the second sampling time, $t_2$.

A set of data elements 1202 is arranged as an array. In this example, the set of data elements 1202 is arranged as a two-dimensional array having two rows and two columns. The set of data elements 1202 includes a first data element, "0", indicative of a measure of a change between the sampled value, "10", obtained from the first sensor $S_1$ at the first sampling time, $t_1$, and the sampled value, "10", obtained from the first sensor $S_1$ at the second sampling time, $t_2$. The set of data elements 1202 further includes a second data element, "0", indicative of a measure of a change between the sampled value, "−2", obtained from the second sensor $S_2$ at the first sampling time, $t_1$, and the sampled value, "−2", obtained from the second sensor $S_2$ at the second sampling time, $t_2$. The set of data elements 1202 further includes a third data element, "0", indicative of a measure of a change between the sampled value, "22", obtained from the fourth sensor $S_4$ at the first sampling time, $t_1$, and the sampled value, "22", obtained from the fourth sensor $S_4$ at the second sampling time, $t_2$. The set of data elements 1202 further includes a fourth data element, "1", indicative of a measure of a change between the sampled value, "1", obtained from the third sensor $S_3$ at the first sampling time, $t_1$, and the sampled value, "2", obtained from the third sensor $S_3$ at the second sampling time, $t_2$.

In this example, the first set of sampled values 1200, the second set of sampled values 1201 and the set of data elements 1202 are arranged as a same type of array, namely in the form of 2×2 matrices.

Figure 13:
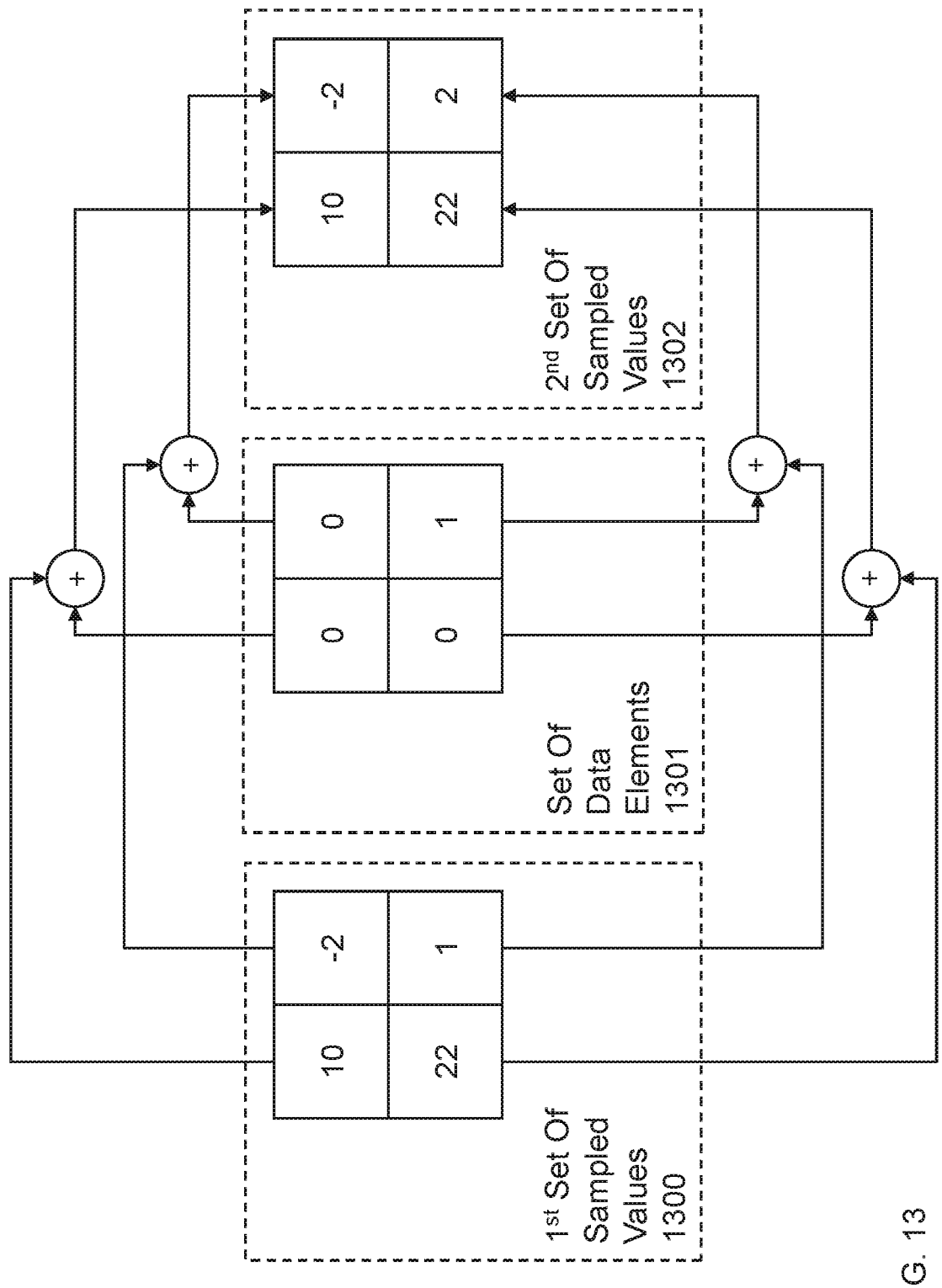
FIG. 13 shows a schematic block diagram of an example of a method of processing telemetry data in accordance with an embodiment of the present invention.

Referring to FIG. 13, there is shown schematically an illustration of an example of a method of processing telemetry data.

The illustration in FIG. 13 corresponds to the illustration shown in FIG. 11. However, FIG. 13 indicates sampled values and data elements based on the examples shown in FIGS. 2 and 3 the example of the dynamic mapping rule described above with reference to FIG. 9.

In this example, a remote data processing unit has received a first set of sampled values 1300 and a set of data elements 1301 from a data processing device. The remote data processing unit has decoded and/or decrypted the received data as needed.

The remote data processing unit is able to recover a second set of sampled values 1302 using the received first set of sampled values 1300 and the received set of data elements 1301. In this example, the remote data processing unit does not receive the second set of sampled values 1302 or an encoded version of the second set of sampled values 1302 from the data processing device, but uses the received first set of sampled values 1300 and the received set of data elements 1301 to recover the second set of sampled values 1302.

The remote data processing unit recovers the sampled value, "10", obtained from the first sensor $S_1$ at the second sampling time, $t_2$, by adding the first data element value, "0", to the sampled value, "10", obtained from the first sensor $S_1$ at the first sampling time, $t_1$. The remote data processing unit recovers the sampled value, "−2", obtained from the second sensor $S_2$ at the second sampling time, $t_2$, by adding the second data element value, "0", to the sampled value, "−2", obtained from the second sensor $S_2$ at the first sampling time, $t_1$. The remote data processing unit recovers the sampled value, "22", obtained from the fourth sensor $S_4$ at the second sampling time, $t_2$, by adding the third data element value, "0", to the sampled value, "22", obtained from the fourth sensor $S_4$ at the first sampling time, $t_1$. The remote data processing unit recovers the sampled value, "2", obtained from the third sensor $S_3$ at the second sampling time, $t_2$, by adding the fourth data element value, "1", to the sampled value, "1", obtained from the third sensor $S_3$ at the first sampling time, $t_1$.

Figure 14:
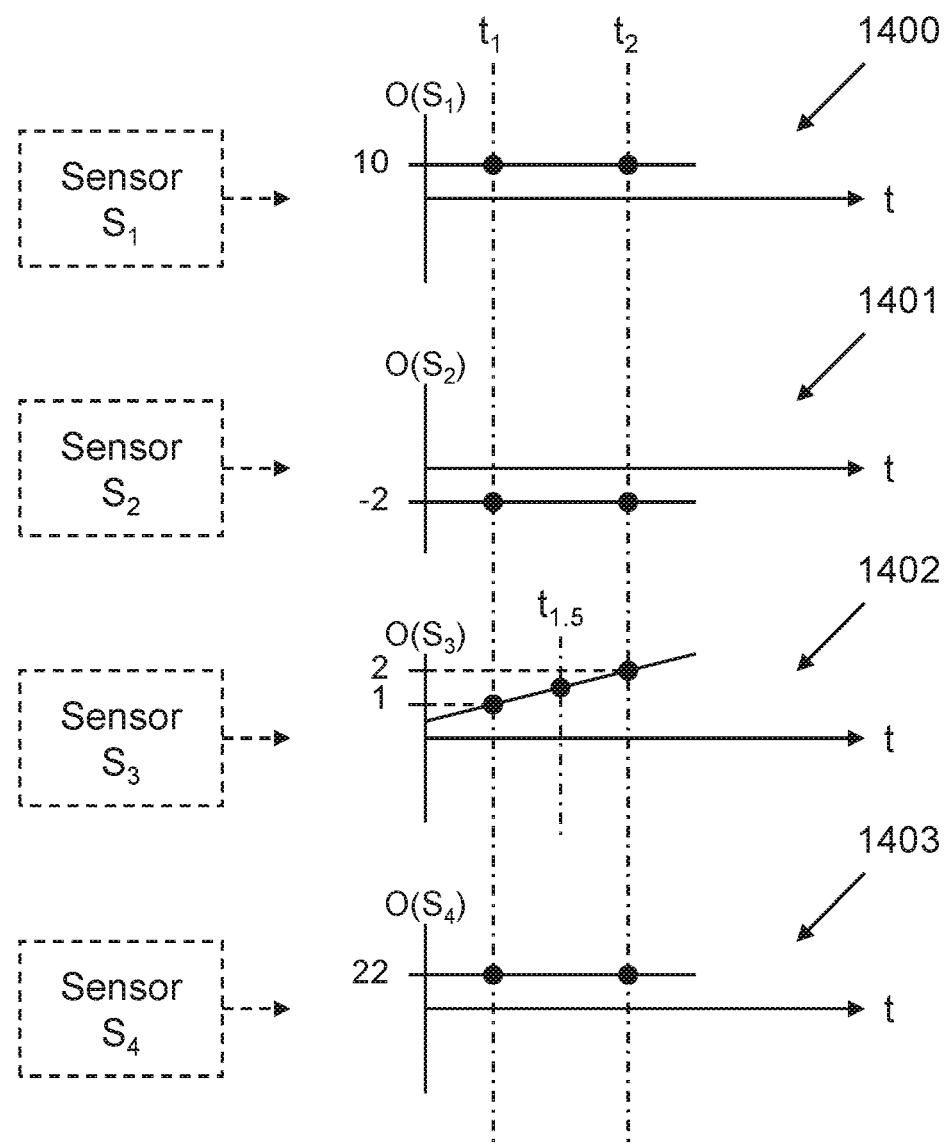
FIG. 14 shows schematically a series of graphs illustrating examples of output data from a plurality of sensors associated with a vehicle.

Referring to FIG. 14, there is shown a series of graphs illustrating examples output data from a plurality of sensors associated with a vehicle.

In this example, the example output data is the same as the output data shown in FIG. 2. Corresponding graphs are shown in FIG. 14 using the same reference numerals as those used in FIG. 2, but incremented by 1200.

In this example, the output data from the first sensor $S_1$, the second sensor $S_2$, and the fourth sensor $S_4$ is sampled at a first sampling rate. In this example, the first sampling rate is indicated by the difference between the first sampling time, $t_1$, and the second sampling time, $t_2$.

In this example, the output data from the third sensor $S_3$ is sampled at a second sampling rate. In this example, the second sampling rate is indicated by the difference between the first sampling time, $t_1$, and an intermediate sampling time, $t_{1.5}$, and between the intermediate sampling time, $t_{1.5}$, and the second sampling time, $t_2$. In this example, the second sampling rate is higher than the first sampling rate. In this specific example, the second sampling rate is twice the first sampling rate. As such, in this example, samples of the output data from the third sensor $S_3$ are obtained twice as often as they are from the output data from the first sensor $S_1$, the second sensor $S_2$, and the fourth sensor $S_4$. In this example, the sampled value obtained from third sensor $S_3$ at the intermediate sampling time, $t_{1.5}$, is "1.5".

In this example, a data processing device is configured to generate a first set of sampled values and a second set of sampled values at the second, higher sampling rate.

In this example, the first set of sampled values is associated with the first sampling time, $t_1$. In this example, the data processing device is configured to generate the first set of sampled values using a sampled value "1" obtained using the third sensor $S_3$ at the first sampling time, $t_1$. In this example, the data processing device is configured to generate the first set of sampled values also using sampled values obtained from the first sensor $S_1$, the second sensor $S_2$, and the fourth sensor $S_4$, at the first sampling time, $t_1$, the sampled values being "10", "−2" and "22" respectively.

In this example, a second set of sampled values is associated with the intermediate sampling time, $t_{1.5}$. In this example, the data processing device is configured to generate the second set of sampled values using a sampled value "1.5" obtained using the third sensor $S_3$ at the intermediate sampling time, $t_{1.5}$. In this example, the data processing device is configured to generate the second set of sampled values also using the sampled values previously obtained from the first sensor $S_1$, the second sensor $S_2$, and the fourth sensor $S_4$, at the first sampling time, $t_1$, the sampled values being "10", "−2" and "22" respectively. The data processing device is configured to use the previously obtained sampled values from the first sensor $S_1$, the second sensor $S_2$, and the fourth sensor $S_4$, because newer sampled values are not available from the first sensor $S_1$, the second sensor $S_2$, and the fourth sensor $S_4$, at the intermediate sampling time, $t_{1.5}$.

In this example, a third set of sampled values is associated with the second sampling time, $t_2$. In this example, the data processing device is configured to generate the third set of sampled values using a sampled value "2" obtained using the third sensor $S_3$ at the second sampling time, $t_2$. In this example, the data processing device is configured to generate the third set of sampled values also using the sampled values obtained from the first sensor $S_1$, the second sensor $S_2$, and the fourth sensor $S_4$, at the second sampling time, $t_2$, the sampled values being "10", "−2" and "22" respectively.

As such, sampling may be performed at different sampling rates. Sampling rates may depend, for example, on the type of sensor concerned and/or one or more sensor configuration parameters.

In this example, the rate used for generating the first, second and third sets of sampled values is the highest sampling rate across all of the sensors $S_1$, $S_2$, $S_3$, $S_4$. If other sensors $S_1$, $S_2$, $S_3$, $S_4$ are sampled at a lower sampling rate, then the most recent value is used until the next sample for that sensor $S_1$, $S_2$, $S_3$, $S_4$ is available.

By sampling at the highest sampling rate across all of the sensors $S_1$, $S_2$, $S_3$, $S_4$ the sampled values from the one or more sensors $S_1$, $S_2$, $S_3$, $S_4$ with the highest sampling rates are still reported to the remote data processing unit. If the lowest sampling rate were used instead, some of the available sampled values from the one or more sensors $S_1$, $S_2$, $S_3$, $S_4$ with the highest sampling rates may not be reported to the remote data processing unit.

Figure 15:
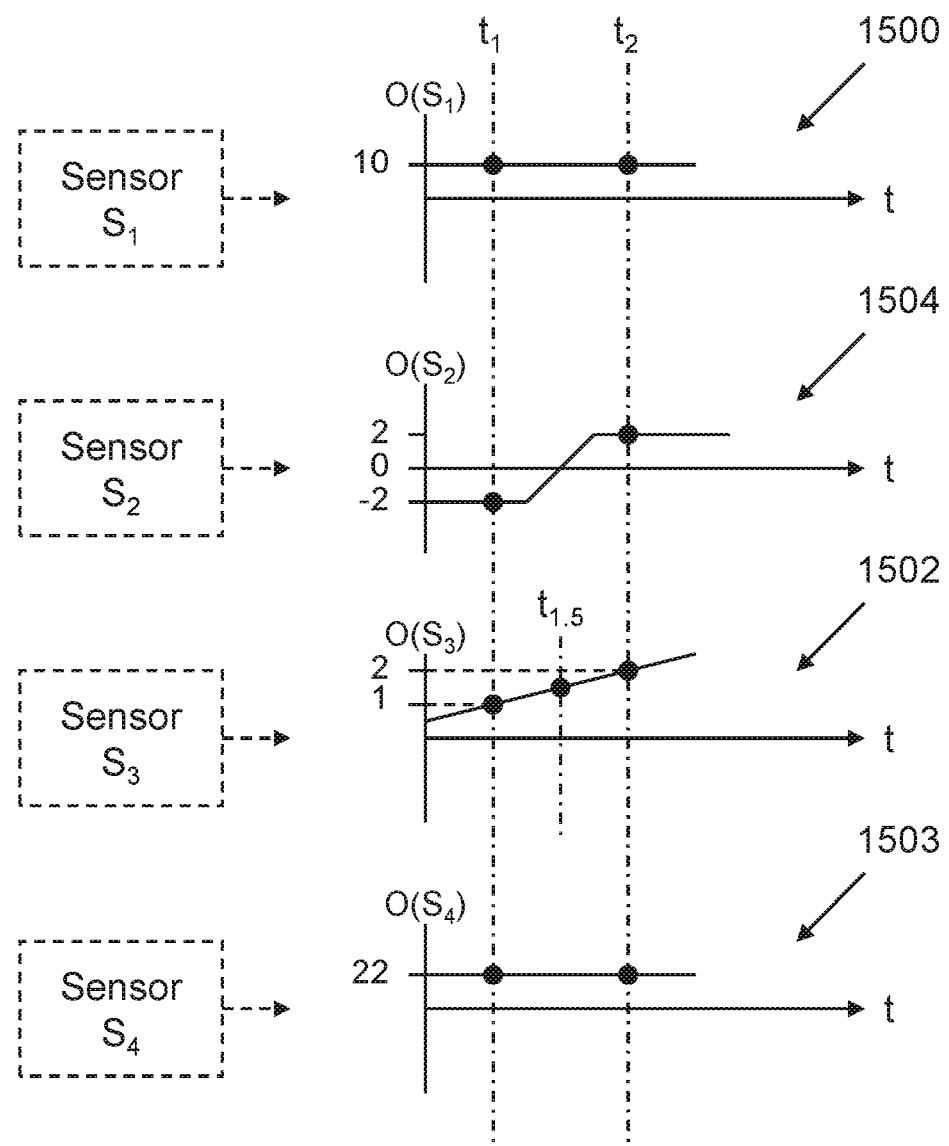
FIG. 15 shows schematically a series of graphs illustrating examples of output data from a plurality of sensors associated with a vehicle.

Referring to FIG. 15, there is shown a series of graphs illustrating examples of output data from a plurality of sensors associated with a vehicle.

In this example, the example output data from the first sensor $S_1$, the third sensor $S_3$ and the fourth sensor $S_4$ is the same as the output data shown in FIG. 2. Graphs that are common to both FIGS. 2 and 15 are shown in FIG. 15 using the same reference numerals as those used in FIG. 2, but incremented by 1300.

However, in this example, the output, $O(S_2)$, of the second sensor $S_2$ is different from the output, $O(S_2)$, of the second sensor $S_2$ shown in graph 201 in FIG. 2.

Output data from the second sensor $S_2$ in accordance with this example is shown in a graph 1504. The graph 1504 indicates how the output, $O(S_2)$, of the second sensor $S_2$ varies over time, t. In this example, the output, $O(S_2)$, of the second sensor $S_2$ starts at a constant value of "−2" and is at the value of "−2" at the first sampling time, $t_1$. The output, $O(S_2)$, of the second sensor $S_2$ remains at a constant value of "−2" until a quarter of the way between the first sampling time, $t_1$, and the second sampling time, $t_2$, where is increases linearly. At the intermediate sampling time, $t_{1.5}$, halfway between the first sampling time, $t_1$, and the second sampling time, $t_2$, the output, $O(S_2)$, of the second sensor $S_2$ is "0". The output, $O(S_2)$, of the second sensor $S_2$ continues to increase linearly until three quarters of the way between the first sampling time, $t_1$, and the second sampling time, $t_2$, at which point the output, $O(S_2)$, of the second sensor $S_2$ is "2". Subsequently, the output, $O(S_2)$, of the second sensor $S_2$ remains at a constant value of "2".

In this example, the output data from the first sensor $S_1$, the second sensor $S_2$, and the fourth sensor $S_4$ is sampled at a first sampling rate. In this example, the first sampling rate is indicated by the difference between the first sampling time, $t_1$, and the second sampling time, $t_2$.

In this example, the output data from the third sensor $S_3$ is sampled at a second sampling rate. In this example, the second sampling rate is indicated by the difference between the first sampling time, $t_1$, and an intermediate sampling time, $t_{1.5}$, and between the intermediate sampling time, $t_{1.5}$, and the second sampling time, $t_2$. In this example, the second sampling rate is higher than the first sampling rate. In this specific example, the second sampling rate is twice the first sampling rate. As such, in this example, samples of the output data from the third sensor $S_3$ are taken twice as often as they are from the output data from the first sensor $S_1$, the second sensor $S_2$, and the fourth sensor $S_4$.

In this example, the data processing device is configured to generate a first set of sampled values and a second set of sampled values at the second, higher sampling rate.

In this example, the first set of sampled values is associated with the first sampling time, $t_1$. In this example, the data processing device is configured to generate the first set of sampled values using a sampled value "1" obtained using the third sensor $S_3$ at the first sampling time, $t_1$. In this example, the data processing device is configured to generate the first set of sampled values also using sampled values obtained from the first sensor $S_1$, the second sensor $S_2$, and the fourth sensor $S_4$, at the first sampling time, $t_1$, the sampled values being "10", "−2" and "22" respectively.

In this example, a second set of sampled values is associated with the intermediate sampling time, $t_{1.5}$. In this example, the data processing device is configured to generate the second set of sampled values using a sampled value "1.5" obtained using the third sensor $S_3$ at the intermediate sampling time, $t_{1.5}$. In this example, the data processing device is configured to generate the second set of sampled values also using the sampled values previously obtained from the first sensor $S_1$, the second sensor $S_2$, and the fourth sensor $S_4$, at the first sampling time, $t_1$, the sampled values being "10", "−2" and "22" respectively. The data processing device is configured to use the previously obtained sampled values from the first sensor $S_1$, the second sensor $S_2$, and the fourth sensor $S_4$, because newer sampled values are not available from the first sensor $S_1$, the second sensor $S_2$, and the fourth sensor $S_4$, at the intermediate sampling time, $t_{1.5}$. In particular, the sampled value in the second set of sampled values obtained using the second sensor $S_2$ is "−2", even though the actual value of the output data of the second sensor $S_2$ at the intermediate sampling time, $t_{1.5}$ is "0". This is because the second sensor $S_2$ is sampled at the first sampling time, $t_1$, and the second sampling time, $t_2$, but not at the intermediate sampling time, $t_{1.5}$. As such the sampled value "−2" obtained using the second sensor $S_2$ at the first sampling time, $t_1$, is the most recent sampled value available for the second sensor $S_2$ at the intermediate sampling time, $t_{1.5}$.

In this example, a third set of sampled values is associated with the second sampling time, $t_2$. In this example, the data processing device is configured to generate the third set of sampled values using a sampled value "2" obtained using the third sensor $S_3$ at the second sampling time, $t_2$. In this example, the data processing device is configured to generate the third set of sampled values also using the sampled values obtained from the first sensor $S_1$, the second sensor $S_2$, and the fourth sensor $S_4$, at the second sampling time, $t_2$, the sampled values being "10", "−2" and "22" respectively.

Figure 16:
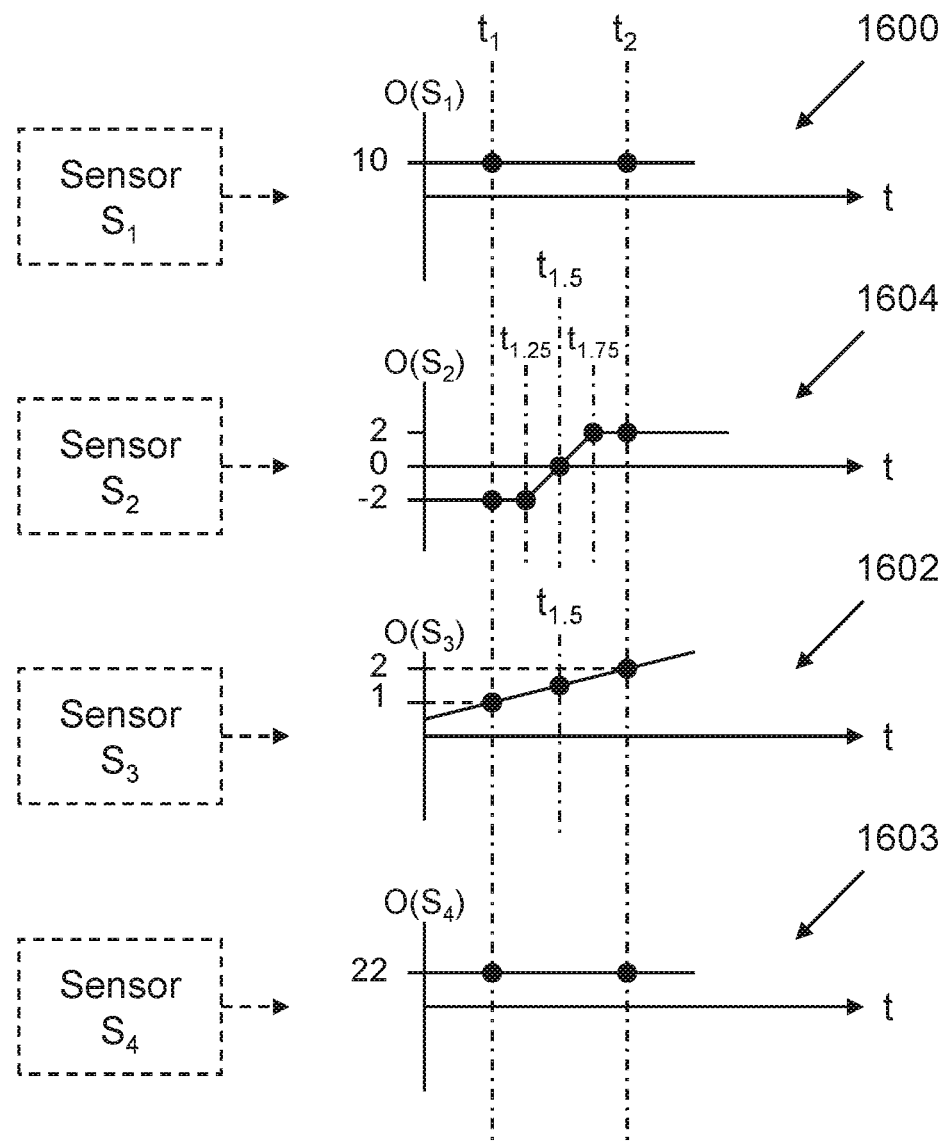
FIG. 16 shows schematically a series of graphs illustrating examples of output data from a plurality of sensors associated with a vehicle.

Referring to FIG. 16, there is shown a series of graphs illustrating examples of output data from a plurality of sensors associated with a vehicle.

In this example, the example output data is the same as the output data shown in FIG. 15. Corresponding graphs are shown in FIG. 16 using the same reference numerals as those used in FIG. 15, but incremented by 100.

In this example, the output data from the first sensor $S_1$ and the fourth sensor $S_4$ is sampled at a first sampling rate. In this example, the first sampling rate is indicated by the difference between the first sampling time, $t_1$, and the second sampling time, $t_2$.

In this example, the output data from the third sensor $S_3$ is sampled at a second sampling rate. In this example, the second sampling rate is indicated by the difference between the first sampling time, $t_1$, and an intermediate sampling time, $t_{1.5}$, and between the intermediate sampling time, $t_{1.5}$, and the second sampling time, $t_2$. In this example, the second sampling rate is higher than the first sampling rate. In this specific example, the second sampling rate is twice the first sampling rate. As such, in this example, samples of the output data from the third sensor $S_3$ are obtained twice as often as they are from the output data from the first sensor $S_1$, and the fourth sensor $S_4$. In this example, the sampled value obtained from third sensor $S_3$ at the intermediate sampling time, $t_{1.5}$, is "1.5".

In this example, the output data from the second sensor $S_2$ is sampled at a third sampling rate. In this example, the third sampling rate is indicated by the difference between the first sampling time, $t_1$, and a first further intermediate sampling time, $t_{1.25}$, the difference between the first further intermediate sampling time, $t_{1.25}$, and the intermediate sampling time, $t_{1.5}$, the difference between the intermediate sampling time, $t_{1.5}$, and a second further intermediate sampling time, $t_{1.75}$, and the difference between and between the second further intermediate sampling time, $t_{1.75}$, and the second sampling time, $t_2$. In this example, the third sampling rate is higher than the first and second sampling rates. In this specific example, the third sampling rate is twice the second sampling rate and four times the first sampling rate. As such, in this example, samples of the output data from the second sensor $S_2$ are obtained twice as often as they are from the output data from the third sensor $S_3$, and four times as often as they are from the first sensor $S_1$ and the fourth sensor $S_4$. In this example, the sampled value obtained from the second sensor $S_2$ at the first further intermediate sampling time, $t_{1.25}$, is "−2", at the intermediate sampling time, $t_{1.5}$, is "0" and at the second further intermediate sampling time, $t_{1.75}$, is "2".

In this example, the data processing device is configured to generate a sets of sampled values at the third, highest sampling rate.

In this example, the first set of sampled values is associated with the first sampling time, $t_1$. In this example, the data processing device is configured to generate the first set of sampled values using a sampled value "−2" obtained using the second sensor $S_2$ at the first sampling time, $t_1$, and a sampled value "1" obtained using the third sensor $S_3$ at the first sampling time, $t_1$. In this example, the data processing device is configured to generate the first set of sampled values also using sampled values obtained from the first sensor $S_1$ and the fourth sensor $S_4$ at the first sampling time, $t_1$, the sampled values being "10" and "22" respectively.

In this example, a second set of sampled values is associated with the first further intermediate sampling time, $t_{1.25}$. In this example, the data processing device is configured to generate the second set of sampled values using a sampled value "−2" obtained using the second sensor $S_2$ at the first further intermediate sampling time, $t_{1.25}$. In this example, the data processing device is configured to generate the second set of sampled values also using the sampled values previously obtained from the first sensor $S_1$, the third sensor $S_3$, and the fourth sensor $S_4$, at the first sampling time, $t_1$, the sampled values being "10", "1" and "22" respectively. The data processing device is configured to use the previously obtained sampled values from the first sensor $S_1$, the third sensor $S_3$, and the fourth sensor $S_4$, because newer sampled values are not available from the first sensor $S_1$, the third sensor $S_3$, and the fourth sensor $S_4$, at the first further intermediate sampling time, $t_{1.25}$.

In this example, a third set of sampled values is associated with the intermediate sampling time, $t_{1.5}$. In this example, the data processing device is configured to generate the third set of sampled values using a sampled value "0" obtained using the second sensor $S_2$ at the intermediate sampling time, $t_{1.5}$, and using a sampled value "1.5" obtained using the third sensor $S_3$ at the intermediate sampling time, $t_{1.5}$. In this example, the data processing device is configured to generate the third set of sampled values also using the sampled values previously obtained from the first sensor $S_1$ and the fourth sensor $S_4$, at the first sampling time, $t_1$, the sampled values being "10" and "22" respectively. The data processing device is configured to use the previously obtained sampled values from the first sensor $S_1$ and the fourth sensor $S_4$, because newer sampled values are not available from the first sensor $S_1$ and the fourth sensor $S_4$, at the intermediate sampling time, $t_{1.5}$.

In this example, a fourth set of sampled values is associated with the second further intermediate sampling time, $t_{1.75}$. In this example, the data processing device is configured to generate the fourth set of sampled values using a sampled value "2" obtained using the second sensor $S_2$ at the second further intermediate sampling time, $t_{1.75}$. In this example, the data processing device is configured to generate the fourth set of sampled values also using a sampled value "1.5" obtained using the third sensor $S_3$ at the intermediate sampling time, $t_{1.5}$. In this example, the data processing device is configured to generate the fourth set of sampled values also using the sampled values previously obtained from the first sensor $S_1$ and the fourth sensor $S_4$, at the first sampling time, $t_1$, the sampled values being "10" and "22" respectively. The data processing device is configured to use the previously obtained sampled values from the first sensor $S_1$, the third sensor $S_3$, and the fourth sensor $S_4$, because newer sampled values are not available from the first sensor $S_1$, the third sensor $S_3$, and the fourth sensor $S_4$, at the second further intermediate sampling time, $t_{1.75}$.

In this example, a fifth set of sampled values is associated with the second sampling time, $t_2$. In this example, the data processing device is configured to generate the fifth set of sampled values using a sampled value "2" obtained using the second sensor $S_2$ at the second sampling time, $t_2$. In this example, the data processing device is configured to generate the fifth set of sampled values also using a sampled value "2" obtained using the third sensor $S_3$ at the second sampling time, $t_2$. In this example, the data processing device is configured to generate the fourth set of sampled values also using the sampled values obtained from the first sensor $S_1$ and the fourth sensor $S_4$ at the second sampling time, $t_2$, the sampled values being "10" and "22" respectively.

In this example, five sets of sampled values are generated, each set being associated with a different sampling time.

In some examples, a reference set of sampled values serves as a reference for deriving data elements associated with a plurality of subsequent sets of sampled values. For example, a first set of data elements may be derived in which a data element is indicative of a measure of a change between a sampled value in the first set of sampled values and a corresponding sampled value in the second set of sampled values. A second set of data elements may be derived in which a data element is indicative of a measure of a change between a sampled value in the first set of sampled values and a corresponding sampled value in the third set of sampled values. A third set of data elements may be derived in which a data element is indicative of a measure of a change between a sampled value in the first set of sampled values and a corresponding sampled value in the fourth set of sampled values. A fourth set of data elements may be derived in which a data element is indicative of a measure of a change between a sampled value in the first set of sampled values and a corresponding sampled value in the fifth set of sampled values.

In some examples, a reference set of sampled values serves as a reference for deriving data elements associated with a single subsequent set of sampled values. For example, a first set of data elements may be derived in which a data element is indicative of a measure of a change between a sampled value in the first set of sampled values and a corresponding sampled value in the second set of sampled values. A second set of data elements may be derived in which a data element is indicative of a measure of a change between a sampled value in the second set of sampled values and a corresponding sampled value in the third set of sampled values. A third set of data elements may be derived in which a data element is indicative of a measure of a change between a sampled value in the third set of sampled values and a corresponding sampled value in the fourth set of sampled values. A fourth set of data elements may be derived in which a data element is indicative of a measure of a change between a sampled value in the fourth set of sampled values and a corresponding sampled value in the fifth set of sampled values.

One or more reference sets of sampled values may be transmitted intermittently to allow the remote data processing unit to synchronize with the current sampled values obtained by the data processing device.

Figure 17:
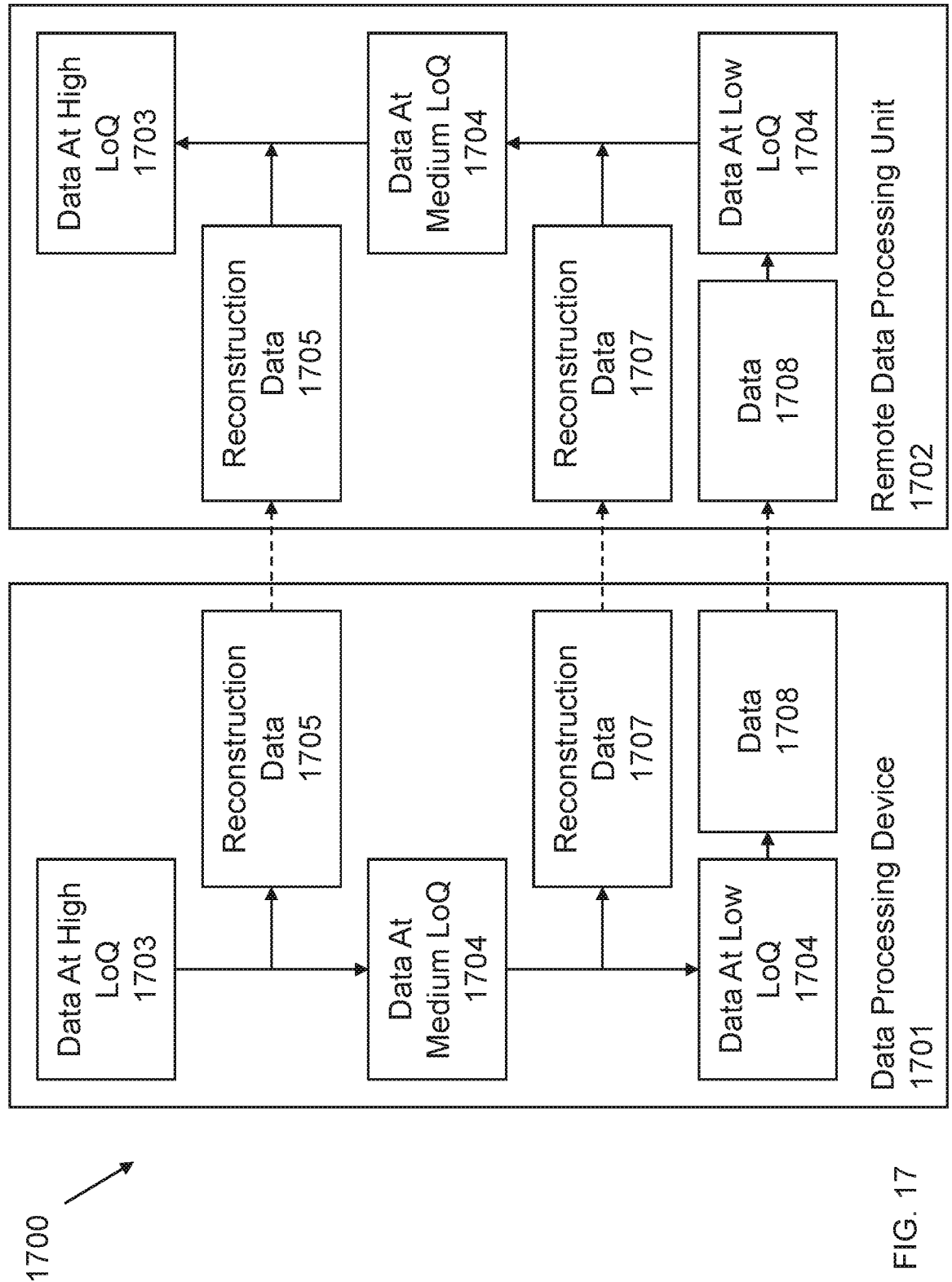
FIG. 17 shows a schematic block diagram of an example of a data processing system in accordance with an embodiment of the present invention.

Referring to FIG. 17, there is shown a schematic block diagram of an example of a data processing system 1700.

The data processing system 1700 may be used to encode and decode data. Examples of such data include, but are not limited to, the first set of sampled values and the set of data elements.

The signal processing system 1700 includes a data processing device 1701 and a remote data processing unit 1702. In this example, the data processing device 1701 comprises encoder functionality. The encoder functionality may be provided by one or more hardware and/or one or more software components. In this example, the remote data processing unit 1702 comprises decoding functionality. The decoding functionality may be provided by one or more hardware and/or one or more software components.

In this example, the data processing system 1700 is used to implement a hierarchical encoding technique, as will now be described.

In this example, the data processing device 1701 receives data to be encoded. The data to be encoded is at a relatively high level of quality 1703. For convenience and brevity, in this example, the data to be encoded is in the form of a two-dimensional array of values, it being understood that the data to be encoded may be of a different type. For example, the data to be encoded may in the form of a one-dimensional array of values, an array of values having more than two dimensions, or data arranged in a form other than an array.

The data processing system 1700 provides renditions of the data at multiple different levels of quality (LoQs). In this example, the data processing system 1700 provides renditions of the data at three different levels of quality, it being understood that renditions of the data at a different number of levels of quality could be provided. In this specific example, the data processing system 1700 provides renditions of the data at relatively high, medium and relatively low levels of quality. In some examples, the data processing system 1700 provides the renditions of the data at multiple different levels of quality in a lossless manner. In other words, in such examples, a rendition of the data at a higher level of quality can be fully recovered from a rendition of the data at a lower level of quality so that no data is lost by processing the data at different levels of quality.

In this example, the data processing device 1701 processes the data at the relatively high level of quality 1703 to produce a rendition of the data at a medium level of quality 1704 and to produce reconstruction data 1705. The reconstruction data 1705 indicates how to reconstruct the rendition of the data at the relatively high level of quality 1703 using the rendition of the data at the medium level of quality 1704. Reconstruction of the data at the relatively high level of quality may involve using other data.

The data processing device 1701 processes the rendition of the data signal at the medium level of quality 1704 to produce a rendition of the data at a relatively low level of quality 1706 and to produce reconstruction data 1707. The reconstruction data 1707 indicates how to reconstruct the rendition of the data at the medium level of quality 1704 using the rendition of the data at the relatively low level of quality 1706. Reconstruction of the data at the medium level of quality 1704 may involve using other data.

The data processing device 1701 generates data 1708 usable to derive the rendition of the data at the relatively low level of quality 1706. The data 1708 usable to derive the rendition of the data at the relatively low level of quality 1706 may for example comprise an encrypted version of the rendition of the data at the relatively low level of quality 1706. The remote data processing unit 1702 can then decrypt the encrypted version 1708 of the rendition of the data at the relatively low level of quality 1706 to derive the rendition of the data at the relatively low level of quality 1706.

The data processing device 1701 transmits the data 1708 usable to derive the rendition of the data at the relatively low level of quality 1706 and the reconstruction data 1705, 1707 to the remote data processing unit 1702.

The remote data processing unit 1702 uses the data 1708 usable to derive the rendition of the data at the relatively low level of quality 1706 to derive the rendition of the data at the relatively low level of quality 1706. This may for example involve the remote data processing unit 1702 decrypting the received data 1708 usable to derive the rendition of the data at the relatively low level of quality 1706.

The remote data processing unit 1702 uses the reconstruction data 1707 and the rendition of the data at the relatively low level of quality 1706 to reconstruct the rendition of the data at the medium level of quality 1704. As such, the rendition of the data at the relatively low level of quality 1706 is used as a baseline for reconstructing the rendition of the data at the medium level of quality 1704.

The remote data processing unit 1702 uses the reconstruction data 1705 and the rendition of the data at the medium level of quality 1704 to reconstruct the rendition of the data at the relatively high level of quality 1703. As such the rendition of the data at the medium level of quality 1704 is used as a baseline for reconstructing the rendition of the data at the relatively high level of quality 1703.

In some examples, the data processing device 1701 is configured to encrypt only the rendition of the data at the relatively low level of quality 1706. Without having the decrypted version of the data at the relatively low level of quality 1706, it may not be possible to reconstruct the rendition of the data at the medium level of quality 1704 and/or the relatively high level of quality 1703. Encrypting only the rendition of the data at the relatively low level of quality 1706, rather than also encrypting the rendition of the data at the relatively high level of quality 1703 and/or the rendition of the data at the medium level of quality 1704 may reduce complexity and/or processing time without significantly sacrificing data security requirements.

The reader is referred to WO-A2-2013/011496, which describes various examples of encoding techniques, which may be used in association with the techniques described herein. The entire contents of WO-A2-2013/011496 are hereby incorporated herein by reference.

Figure 18:
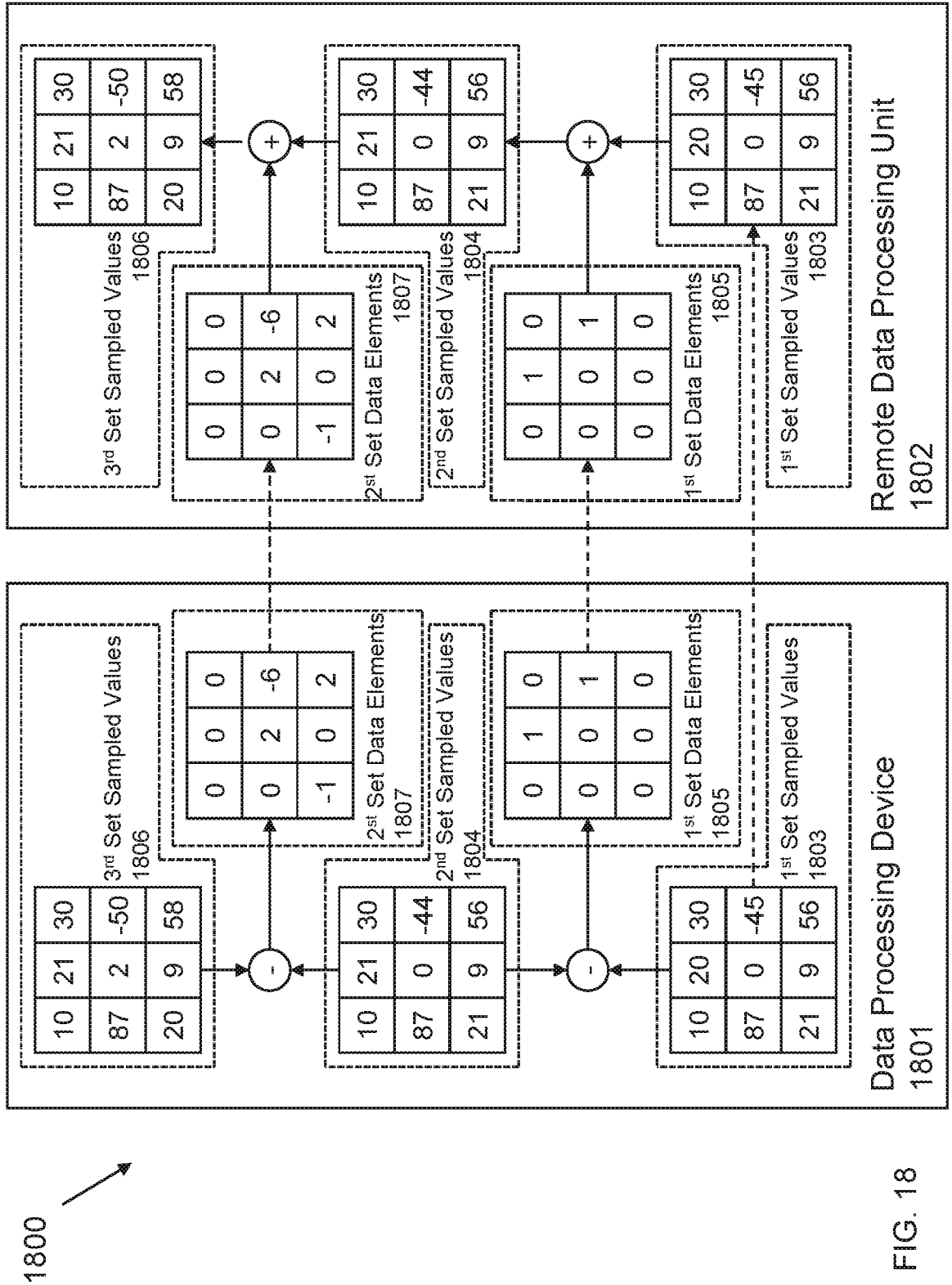
FIG. 18 shows a schematic block diagram of an example of a data processing system in accordance with an embodiment of the present invention.

Referring to FIG. 18, there is shown a schematic block diagram of an example of a data processing system 1800.

The data processing system 1800 may be used to encode and decode data. The signal processing system 1800 includes a data processing device 1801 and a remote data processing unit 1802. In this example, the data processing device 1801 comprises encoder functionality. The encoder functionality may be provided by one or more hardware and/or one or more software components. In this example, the remote data processing unit 1802 comprises decoding functionality. The decoding functionality may be provided by one or more hardware and/or one or more software components.

In this example, the data processing system 1800 is used to implement a hierarchical encoding technique, as will now be described.

In this example, the data processing device 1801 obtains first data 1803. In this example, the first data 1803 is a first set of sampled values.

In this example, the data processing device 1801 obtains second data 1804. In this example, the second data 1804 is a second set of sampled values.

In this example, the data processing device 1801 derives third data 1805. In this example, the third data 1805 is a first set of data elements. Data elements in the first set of data elements 1805 are indicative of a measure of a change between a sampled value in the first set of sampled values 1803 and a corresponding sampled value in the second set of sampled values 1804. In this specific example, data elements in the first set of data elements 1805 are indicative of a difference between a sampled value in the first set of sampled values 1803 and a corresponding sampled value in the second set of sampled values 1804.

In this example, the data processing device 1801 obtains fourth data 1806. In this example, the fourth data 1806 is a third set of sampled values.

In this example, the data processing device 1801 derives fifth data 1807. In this example, the fifth data 1807 is a second set of data elements. Data elements in the second set of data elements 1807 are indicative of a measure of a change between a sampled value in the second set of sampled values 1804 and a corresponding sampled value in the third set of sampled values 1806. In this specific example, data elements in the second set of data elements 1807 are indicative of a difference between a sampled value in the second set of sampled values 1804 and a corresponding sampled value in the third set of sampled values 1806.

In this example, the first set of sampled values 1803, the first set of data elements 1805 and the second set of data elements 1807 are transmitted to the remote data processing unit 1802. Some or all of the first set of sampled values 1803, the first set of data elements 1805 and the second set of data elements 1807 may be processed prior to transmission to the remote data processing unit 1802. For example, some or all of the first set of sampled values 1803, the first set of data elements 1805 and the second set of data elements 1807 may be encrypted and/or encoded.

In this example, the remote data processing unit 1802 obtains the first set of sampled values 1803. The remote data processing unit 1802 may process received data prior to obtaining the first set of sampled values 1803.

In this example, the remote data processing unit 1802 obtains the first set of data elements 1805. The remote data processing unit 1802 may process received data prior to obtaining the first set of data elements 1805. The remote data processing unit 1802 reconstructs the second set of sampled values 1804 using the first set of sampled values 1803 and the first set of data elements 1805.

In this example, the remote data processing unit 1802 obtains the second set of data elements 1807. The remote data processing unit 1802 may process received data prior to obtaining the second set of data elements 1807. The remote data processing unit 1802 reconstructs the third set of sampled values 1806 using the reconstructed second set of sampled values 1804 and the second set of data elements 1807.

The first set of sampled values 1803 may be considered to correspond to a base layer, similar to the rendition of data at a relatively low level of quality 1704 described above. The first set of data elements 1805 may be considered to correspond to enhancement data, similar to the reconstruction data 1707 described above. The second set of sampled values 1804 may be considered to correspond to an enhanced layer, similar to the rendition of data at a medium level of quality 1704 described above. The second set of data elements 1807 may be considered to correspond to enhancement data, similar to the reconstruction data 1705 described above. The third set of sampled values 1806 may be considered to correspond to an enhanced layer, similar to the rendition of data at a relatively high level of quality 1703 described above. As such, a first snapshot of the sampled values may be seen as an initial base layer and one or more further snapshots of the sampled values may be seen as one or more enhancement layers. This allows the application of a hierarchical approach over the sequence of sets of sampled values. By applying such a hierarchical encoding technique in relation to the sampled values described above, a snapshot of the sampled values at a given point in time may be considered to be a temporal enhancement of a base layer, corresponding to a set of measures of difference between the snapshot and one or more previous snapshots.

Figure 19:
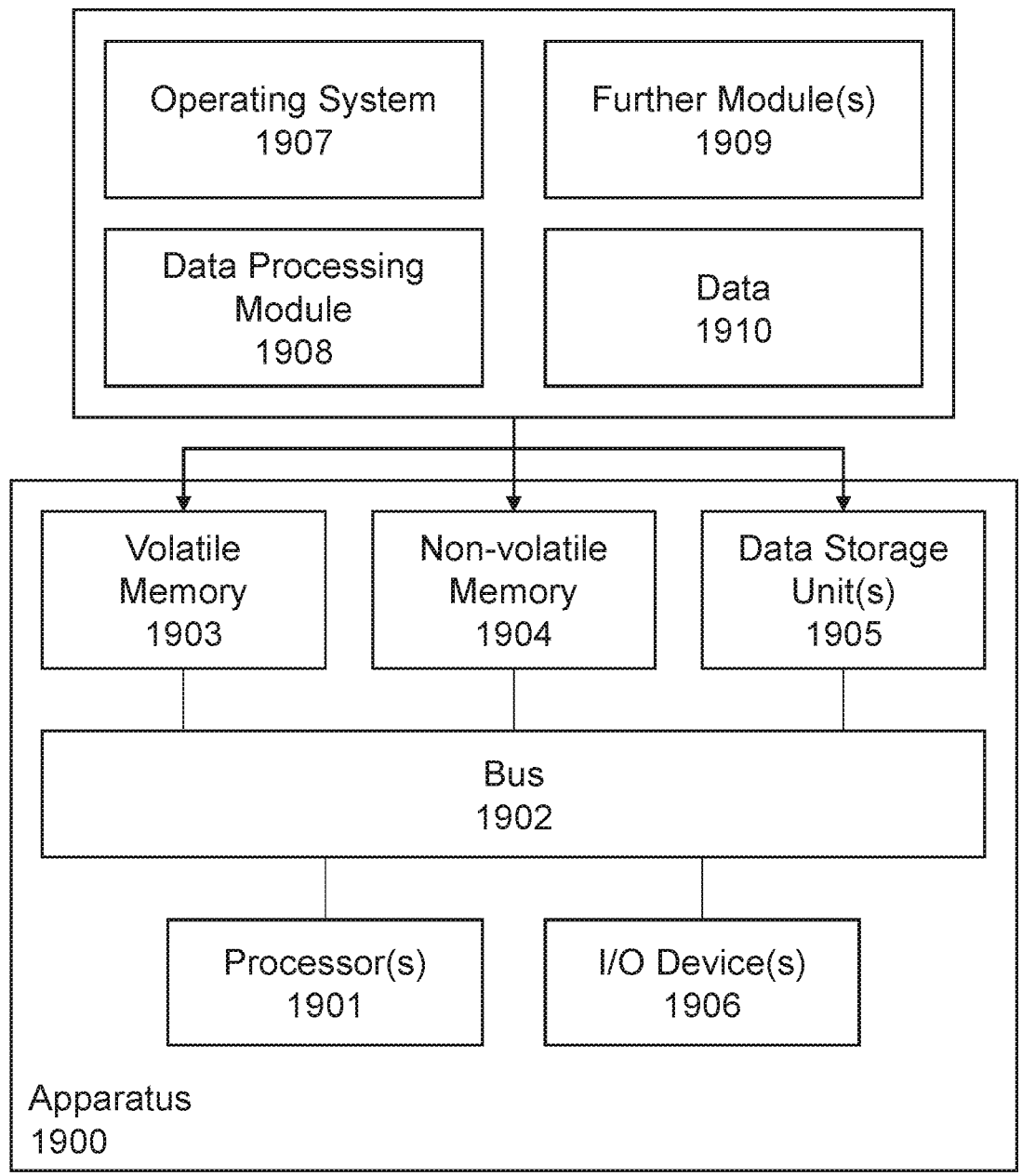
FIG. 19 shows a schematic block diagram of an example of an apparatus in accordance with an embodiment of the present invention.

Referring to FIG. 19, there is shown a schematic block diagram of an example of an apparatus 1900. The apparatus 1900 may be a data processing device as described above. The apparatus 1900 may be a remote data processing unit as described above.

In this example, the apparatus 1900 comprises one or more processors 1901 configured to process information and/or instructions. The one or more processors 1901 may comprise a central processing unit (CPU). The one or more processors 1901 are coupled with a bus 1902. Operations performed by the one or more processors 1901 may be carried out by hardware and/or software. The one or more processors 1901 may comprise multiple co-located processors or multiple disparately located processors.

In this example, the apparatus 1900 comprises computer-useable volatile memory 1903 configured to store information and/or instructions for the one or more processors 1901. The computer-useable volatile memory 1903 is coupled with the bus 1902. The computer-useable volatile memory 1903 may comprise random access memory (RAM).

In this example, the apparatus 1900 comprises computer-useable non-volatile memory 1904 configured to store information and/or instructions for the one or more processors 1901. The computer-useable non-volatile memory 1904 is coupled with the bus 1902. The computer-useable non-volatile memory 1904 may comprise read-only memory (ROM).

In this example, the apparatus 1900 comprises one or more data-storage units 1905 configured to store information and/or instructions. The one or more data-storage units 1905 are coupled with the bus 1902. The one or more data-storage units 1905 may for example comprise a magnetic or optical disk and disk drive or a solid-state drive (SSD).

In this example, the apparatus 1900 comprises one or more input/output (I/O) devices 1906 configured to communicate information to and/or from the one or more processors 1901. The one or more I/O devices 1906 are coupled with the bus 1902. The one or more I/O devices 1906 may comprise at least one network interface. The at least one network interface may enable the apparatus 1900 to communicate via one or more data communications networks. The one or more I/O devices 1906 may enable a user to provide input to the apparatus 1900 via one or more input devices (not shown). The one or more input devices may include for example a keyboard, a mouse, a joystick etc. The one or more I/O devices 1906 may enable information to be provided to a user via one or more output devices (not shown). The one or more output devices may for example include a display screen.

Various other entities are depicted for the apparatus 1900. For example, when present, an operating system 1907, data processing module 1908, one or more further modules 1909, and data 1910 are shown as residing in one, or a combination, of the computer-usable volatile memory 1903, computer-usable non-volatile memory 1904 and the one or more data-storage units 1905. The data processing module 1908 may be implemented by way of computer program code stored in memory locations within the computer-usable non-volatile memory 1904, computer-readable storage media within the one or more data-storage units 1905 and/or other tangible computer-readable storage media. Examples of tangible computer-readable storage media include, but are not limited to, an optical medium (e.g., CD-ROM, DVD-ROM or Blu-ray), flash memory card, floppy or hard disk or any other medium capable of storing computer readable instructions such as firmware or microcode in at least one ROM or RAM or Programmable ROM (PROM) chips or as an Application Specific Integrated Circuit (ASIC).

The apparatus 1900 may therefore comprise a data processing module 1908 which can be executed by the one or more processors 1901. The data processing module 1908 can be configured to include instructions to implement at least some of the operations described herein. During operation, the one or more processors 1901 launch, run, execute, interpret or otherwise perform the instructions in the data processing module 1908.

It will be appreciated that the apparatus 1900 may comprise more, fewer and/or different components from those depicted in FIG. 19.

The apparatus 1900 may be located in a single location or may be distributed in multiple locations.

Although at least some aspects of the examples described herein with reference to the drawings comprise computer processes performed in processing systems or processors, examples described herein also extend to computer programs, for example computer programs on or in a carrier, adapted for putting the examples into practice. The carrier may be any entity or device capable of carrying the program.

The techniques described herein may be implemented in software or hardware, or may be implemented using a combination of software and hardware. They may include configuring an apparatus 1900, such as for example a data processing device and/or a remote data processing unit to carry out and/or support any or all of techniques described herein.

Examples described above relate to compression and transmission of telemetry data substantially in real-time. Examples described above relate to encoding telemetry data as a stream using with temporal encoding. In some examples, the telemetry data is encrypted. In some example, the compression or encoding is lossless. In some examples, the apparatuses and method are compatible with existing hardware and/or software systems.

Various measures (for example apparatuses, methods and computer programs) are provided for processing telemetry data. Sampled data is obtained. The sampled data is output data from a plurality of sensors associated with a vehicle. First and second sets of sampled values are generated using the sampled data. The first set of sampled values is associated with a first sampling time. The second set of sampled values is associated with a second, subsequent sampling time. A set of data elements is derived. A data element is indicative of a measure of a change between a sampled value in the first set of sampled values and a corresponding sampled value in the second set of sampled values. The set of data elements is encoded. Data comprising at least the encoded set of data elements is output for transmission to a remote data processing unit.

The first set of sampled values, the second set of sampled values and the set of data elements may be arranged as a same type of array.

The array may have two or more than two dimensions.

A position of a given sampled value in the first set and/or a given sampled value the second set and/or a given data element in the set of data elements may be determined based on at least one mapping rule.

The sensors in the plurality of sensors may be in a given order and the mapping rule may be configured to preserve an order of the sampled values in the first and/or the sampled values in the second set and/or the data elements in the set of data elements with respect to the given order of the sensors with which the sampled values in the first set and/or the sampled values in the second set and/or the data elements in the set of data elements are associated.

An identity of a given sensor with which a given sampled value in the first set and/or a given sampled value in the second set and/or a given data element in the set of data elements is associated may be determinable based solely on a position of the given sampled value in the first set and/or the given sampled value in the second set and/or the given data element in the set of data elements respectively.

The sensors in the plurality of sensors may be in a given order and the mapping rule may be configured to allow an order of the sampled values in the first set and/or the sampled values in the second set and/or the data elements in the set of data elements to be different with respect to the given order of the sensors with which the sampled values in the first and/or the sampled values in the second set and/or the data elements in the set of data elements are associated.

An identity of a given sensor with which a given sampled value in the first set and/or a given sampled value in the second set and/or a given data element in the set of data elements is associated may be indeterminable based solely on a position of the given sampled value in the first set and/or the given sampled value in the second set and/or the given data element in the set of data elements respectively.

Correlation data may be output for transmission to the remote data processing unit. The correlation data may be arranged to associate the given sampled value in the first set and/or the given sampled value in the second set and/or the given data element in the set of data elements with the given sensor with which the given sampled value in the first set and/or the given sampled value in the second set and/or the given data element in the set of data elements is associated.

A position may be determined for some or all of the sampled values in the first set and/or for some or all of the sampled values in the second set and/or for some or all of the data elements in the set of data elements based on a measure of a variation of the output data from the plurality of sensors.

The sampled values and/or the data elements associated with sensors whose output data changes relatively frequently, compared to sensors whose output data changes relatively infrequently, may be grouped together.

The sampled values and/or data elements associated with sensors whose output data changes relatively infrequently, compared to sensors whose output data changes relatively frequently, may be grouped together.

A sampled value obtained from a given sensor in the plurality of sensors at the first sampling time and a sampled value obtained from the given sensor at the second sampling time may be mapped to a given position in the first set and to the same given position in the second set.

A sampled value obtained from a given sensor in the plurality of sensors at the first sampling time and a sampled value obtained from the given sensor at the second sampling time may be mapped to a first position in the first set and a second, different position in the second set.

The output data from at least one first sensor in the plurality of sensors may be sampled at a first sampling rate. The output data from at least one second sensor in the plurality of sensors may be sampled at a second, higher sampling rate. The first set of sampled values and second set of sampled values may be generated at the second, higher sampling rate.

The second set of sampled values may be generated using a sampled value obtained using the at least one first sensor at the first sampling time.

The second set of sampled values may be generated using a sampled value obtained using the at least one second sensor at the second sampling time.

Data based on the first set of sampled values may be output for transmission to the remote data processing unit.

The first set of sampled values may be encoded. Data based on the encoded first set of sampled values may be output for transmission to the remote data processing unit.

The set of data elements may be encoded using a first codec. The first set of sampled values may be encoded using a second, different codec.

The first set of sampled values and/or the set of data elements may be encoded based on at least one characteristic of the first set of sampled values and/or the set of data elements.

The first set of sampled values and/or the set of data elements may be encoded using an image and/or video encoding technique.

The first set of sampled values and/or the set of data elements may be encoded using a lossless encoding technique.

The first set of sampled values and/or the set of data elements may be encoded using an entropy encoding technique.

The first set of sampled values and/or the set of data elements may be encoded based on at least one characteristic of a communications channel between the data processing device and the remote data processing unit.

The at least one characteristic of the communications channel may comprise a capacity of the communications channel.

The first set of sampled values and/or data derived from the first set of sampled values may be encrypted. The encrypted first set of sampled values and/or data derived from the first set of sampled values may be output for transmission to the remote data processing unit.

A data element in the set of data elements may be indicative of a measure of a change between an unencrypted sampled value in the first set of sampled values and a corresponding sampled value in the second set of sampled values.

The data derived from the first set of sampled values may be a rendition of the first set of sampled values at a lower level of quality than a level of quality of the first set of sampled values.

Some or all of the sampled values in the first set and/or the second set may be unquantized values of output data.

At least one further set of sampled values may be generated using the sampled output data. The at least one further set of sampled values is associated with at least one further sampling time. At least one further set of data elements is derived. The at least one further set of data elements is encoded. The at least one further encoded set of data elements is output for transmission to the remote data processing unit.

A data element in the at least one further set of data elements may be indicative of a measure of a change between a sampled value in the at least one further set and a sampled value in one of the first set, the second set or another set of data elements.

The transmission may comprise wireless transmission to the remote data processing unit.

The transmission may comprise transmission via one or more satellite communications channels.

The transmission may occur substantially in real-time.

The vehicle may be an aircraft.

The transmission may occur while the aircraft is in-flight.

The sampled data may be obtained from one or more flight-data acquisition units, FDAUs.

The sampled data may be obtained by sampling the output data of the plurality of sensors.

The second set of sampled values may not be encoded.

The second set of sampled values may not be output for transmission to the remote data processing unit.

Various measures (for example apparatuses, methods and computer programs) are provided for processing telemetry data. Data comprising an encoded set of data elements is received from a remote data processing device. A data element in the encoded set of data elements is indicative of a measure of a change between a sampled value in a first set of sampled values and a corresponding sampled value in a second set of sampled values. The first set of sampled values is associated with a first sampling time and the second set of sampled values is associated with a second, subsequent sampling time. The first and second sets of sampled values have been generated using sampled data. The sampled data is based on output data sampled from a plurality of sensors associated with a vehicle. The encoded set of data elements is decoded. At least the decoded set of data elements is used to recover the second set of sampled values.

The first set of sampled values, the second set of sampled values and the set of data elements may all be arranged as a same type of array.

The array may have two or more than two dimensions.

An identity of a given sensor with which a given sampled value in the first set and/or a given sampled value in the second set and/or a given data element in the set of data elements is associated may be determined based solely on determining of a position of the given sampled value in the first set and/or the given sampled value in the second set and/or the given data element in the set of data elements respectively.

Correlation data may be received from the data processing device. The correlation data may be arranged to associate a given sampled value in the first set and/or the given sampled value in the second set and/or the given data element in the set of data elements with a given sensor with which the given sampled value in the first set and/or the given sampled value in the second set and/or the given data element in the set of data elements is associated. An identity of the given sensor may be determined based on the received correlation data.

Data based on the first set of sampled values may be received. The data based on the first set of sampled values may be used to recover the second set of data elements.

The data based on the first set of sampled values may be received in an encrypted form. The data based on the first set of sampled values may be decrypted.

The data based on the first set of sampled values may be received in an encoded form. The data based on the first set of sampled values may be decoded.

The encoded set of data elements may be decoded using a first codec. The data based on the first set of sampled values may be decoded using a second, different codec.

Some or all of the sampled values in the first set and/or the second set may be unquantized values.

At least one further encoded set of data elements may be received from the remote data processing device. The at least one further encoded set of data elements is decoded. At least the decoded at least one further set of data elements is used to recover at least one further set of sampled values.

A data element in the at least one further set of data elements is indicative of a measure of a change between a sampled value in the at least one further set and a sampled value in one of the first set, the second set or another set of data elements.

The data comprising the encoded set of data elements may be received wirelessly.

The data comprising the encoded set of data elements may be received via one or more satellite communications channels.

The vehicle may be an aircraft.

The data comprising the encoded set of data elements may be received while the aircraft is in-flight.

Various measures (for example apparatuses, methods and computer programs) are provided for processing telemetry data in which output data from at least one sensor associated with a vehicle is sampled. First and second sets of sampled data are generated using the sampled output data. The first set of sampled data is associated with a first sampling time. The second set of sampled data is associated with a second sampling time. At least one set of data elements is derived. A data element is indicative of a measure of a change between sampled data in the first set and corresponding sampled data in the second set. At least the set of data elements is encoded. The encoded set of data elements is output for transmission to a data processing unit.

Various measures (for example apparatuses, methods and computer programs) are provided for processing meteorological data in which output data from at least one sensors associated with an aircraft is sampled while the aircraft is in-flight. The at least one sensor is associated with at least one meteorological property. At least one set of sampled data is generated using the sampled output data while the aircraft is in-flight. The at least one set of sampled data is associated with at least one sampling time. The at least one set of sampled data and/or data derived from the at least one set of sampled data is encoded while the aircraft is in-flight. The encoded data is output for transmission to a remote data processing unit while the aircraft is in-flight.

The above embodiments are to be understood as illustrative examples. Further embodiments are envisaged.

In some examples, the data processing device is configured to receive multimedia data. The multimedia may comprise audio, image and/or video data. The data processing device may be configured to output the multimedia data or data based on the multimedia data for transmission to the remote data processing unit. In some examples, the data processing device is configured to process the multimedia data prior to outputting the multimedia data for transmission to the remote data processing unit. Examples of such processing include, but are not limited to, encoding and compressing the multimedia data. The multimedia data or data based on the multimedia data may be output for transmission to the remote data processing unit together with the telemetry data described above or separate from such telemetry data.

In examples described above, the data processing device is configured to output at least the encoded set of data elements for transmission to the remote data processing unit. In some examples, the data processing device is configured to delete data output for transmission to the remote data processing unit following output of the data. In such examples, the amount of memory required to store telemetry data, for example during a journey, may be reduced. In other examples, the data processing device is configured to store some or all of the data output for transmission to the remote data processing unit following output of the data. In such examples, the stored data may subsequently be retrieved and analyzed, for example following a journey involving the vehicle.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A data processing unit for processing telemetry data, the data processing unit being configured to:
  receive data comprising an encoded set of data elements from a remote data processing device, a data element in the encoded set of data elements being indicative of a measure of a change between a sampled value in a first set of sampled values and a corresponding sampled value in a second set of sampled values, a position of a given data element in the set of data elements having been determined based on at least one dynamic mapping rule, the first set of sampled values being associated with a first sampling time and the second set of sampled values being associated with a second, subsequent sampling time, the first and second sets of sampled values having been generated using sampled data, the sampled data being based on output data sampled from at least one first sensor of a plurality of sensors associated with a vehicle and output data from at least one second sensor of the plurality of sensors, the output data from the at least first sensor having been sampled at a first sampling rate and the output data from the at least one second sensor having been sampled at a second, higher sampling rate, wherein a position of a given sample in the first set and a position of a given sample in the second set are based on the at least one dynamic mapping rule;
  decode the encoded set of data elements; and
  use at least the decoded set of data elements to recover the second set of sampled values.

2. A data processing unit according to claim 1, the data processing unit being configured to:
  receive data based on the first set of sampled values; and
  use the data based on the first set of sampled values to recover the second set of data elements.

3. A data processing unit according to claim 2, wherein the data based on the first set of sampled values is received in an encrypted form, the data processing unit being configured to decrypt the data based on the first set of sampled values.

4. A data processing unit according to claim 2, wherein the data based on the first set of sampled values is received in an encoded form, the data processing unit being configured to decode the data based on the first set of sampled values.

5. A data processing unit according to claim 4, the data processing unit being configured to decode the encoded set of data elements using a first codec and to decode the data based on the first set of sampled values using a second, different codec.

6. A data processing unit according to claim 1, wherein the first set of sampled values, the second set of sampled values and the set of data elements are all arranged as a same type of array.

7. A data processing unit according to claim 6, wherein the array has two or more than two dimensions.

8. A data processing unit according to claim 1, the data processing unit being configured to determine an identity of a given sensor with which a given sampled value in the first set and/or a given sampled value in the second set and/or a given data element in the set of data elements is associated based solely on determining of a position of the given sampled value in the first set and/or the given sampled value in the second set and/or the given data element in the set of data elements respectively.

9. A data processing unit according to claim 1, the data processing unit being configured to:
receive correlation data from the remote data processing device, the correlation data being arranged to associate a given sampled value in the first set and/or the given sampled value in the second set and/or the given data element in the set of data elements with a given sensor with which the given sampled value in the first set and/or the given sampled value in the second set and/or the given data element in the set of data elements is associated; and
determine an identity of the given sensor based on the received correlation data.

10. A data processing unit according to claim 1, wherein some or all of the sampled values in the first set and/or the second set are unquantised values.

11. A data processing unit according to claim 1, the data processing device being configured to:
receive at least one further encoded set of data elements from the remote data processing device;
decode the at least one further encoded set of data elements; and
use at least the decoded at least one further set of data elements to recover at least one further set of sampled values.

12. A data processing unit according to claim 11, wherein a data element in the at least one further set of data elements is indicative of a measure of a change between a sampled value in the at least one further set and a sampled value in one of the first set, the second set or another set of data elements.

13. A data processing unit according to claim 1, the data processing unit being configured to receive the data comprising the encoded set of data elements wirelessly.

14. A method of processing telemetry data, the method comprising, at a data processing unit:
receiving data comprising an encoded set of data elements from a remote data processing device, a data element in the encoded set of data elements being indicative of a measure of a change between a sampled value in a first set of sampled values and a corresponding sampled value in a second set of sampled values, a position of a given data element in the set of data elements having been determined based on at least one dynamic mapping rule, the first set of sampled values being associated with a first sampling time and the second set of sampled values being associated with a second, subsequent sampling time, the first and second sets of sampled values having been generated using sampled data, the sampled data being based on output data sampled from at least one first sensor of a plurality of sensors associated with a vehicle and output data from at least one second sensor of the plurality of sensors, the output data from the at least first sensor having been sampled at a first sampling rate and the output data from the at least one second sensor having been sampled at a second, higher sampling rate, wherein a position of a given sample in the first set and a position of a given sample in the second set are based on the at least one dynamic mapping rule;
decoding the encoded set of data elements; and
using at least the decoded set of data elements to recover the second set of sampled values.

15. A method according to claim 14, the method comprising:
receiving data based on the first set of sampled values; and
using the data based on the first set of sampled values to recover the second set of data elements.

16. A method according to claim 15, wherein the data based on the first set of sampled values is received in an encrypted form, the data processing unit being configured to decrypt the data based on the first set of sampled values.

17. A method according to claim 15, wherein the data based on the first set of sampled values is received in an encoded form, the data processing unit being configured to decode the data based on the first set of sampled values, wherein said decoding of the encoded set of data elements comprises using a first codec, and wherein said decoding of the data based on the first set of sampled values comprises using a second, different codec.

18. A method according to claim 14, wherein the first set of sampled values, the second set of sampled values and the set of data elements are all arranged as a same type of array, wherein the array has two or more than two dimensions.

19. A method according to claim 14, comprising:
receiving correlation data from the remote data processing device, the correlation data being arranged to associate a given sampled value in the first set and/or the given sampled value in the second set and/or the given data element in the set of data elements with a given sensor with which the given sampled value in the first set and/or the given sampled value in the second set and/or the given data element in the set of data elements is associated; and
determining an identity of the given sensor based on the received correlation data.

20. A method according to claim 14, comprising:
receiving at least one further encoded set of data elements from the remote data processing device;
decoding the at least one further encoded set of data elements; and
using at least the decoded at least one further set of data elements to recover at least one further set of sampled values,
wherein a data element in the at least one further set of data elements is indicative of a measure of a change between a sampled value in the at least one further set and a sampled value in one of the first set, the second set or another set of data elements.

* * * * *